United States Patent
Moriyama

(10) Patent No.: US 8,809,965 B2
(45) Date of Patent: Aug. 19, 2014

(54) SEMICONDUCTOR DEVICE

(71) Applicant: Panasonic Corporation, Osaka (JP)

(72) Inventor: Yoshiya Moriyama, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/665,207

(22) Filed: Oct. 31, 2012

(65) Prior Publication Data

US 2013/0049135 A1    Feb. 28, 2013

Related U.S. Application Data

(63) Continuation of application No. PCT/JP2011/001998, filed on Apr. 4, 2011.

(30) Foreign Application Priority Data

Sep. 28, 2010    (JP) ................................ 2010-217600

(51) Int. Cl.
*H01L 27/088* (2006.01)
*H01L 21/8234* (2006.01)

(52) U.S. Cl.
CPC *H01L 21/823468* (2013.01); *H01L 21/823462* (2013.01); *H01L 21/823456* (2013.01)
USPC ............................ 257/392; 257/369; 438/275

(58) Field of Classification Search
USPC .......... 257/392, E27.061, E27.099, 324, 369; 438/275, 303, 305, 151
See application file for complete search history.

(56) References Cited

U.S. PATENT DOCUMENTS

| | | | | |
|---|---|---|---|---|
| 5,684,319 | A | * 11/1997 | Hebert | .......................... 257/336 |
| 6,747,319 | B2 | * 6/2004 | Kojima et al. | ................. 257/369 |
| 2002/0048890 | A1 | * 4/2002 | Wieczorek et al. | ........... 438/305 |
| 2003/0059983 | A1 | 3/2003 | Ota et al. | |
| 2006/0226558 | A1 | 10/2006 | Fukai et al. | |

(Continued)

FOREIGN PATENT DOCUMENTS

| JP | 2003-100902 A | 4/2003 |
|---|---|---|
| JP | 2007-273816 A | 10/2007 |

(Continued)

OTHER PUBLICATIONS

International Search Report issued in International Patent Application No. PCT/JP2011/001998 dated Jun. 7, 2011.

*Primary Examiner* — Jarrett Stark
*Assistant Examiner* — Shahed Ahmed
(74) *Attorney, Agent, or Firm* — McDermott Will & Emery LLP

(57) ABSTRACT

A semiconductor device includes a first MIS transistor and a second MIS transistor. The first MIS transistor includes first offset sidewalls formed on side surfaces in a gate width direction of a first gate electrode, second offset sidewalls formed on side surfaces in a gate length direction and the side surfaces of the gate width direction of the first gate electrode with the first offset sidewalls being interposed between the second offset sidewalls and the first gate electrode, and first extension regions. The second MIS transistor includes third offset sidewalls formed on side surfaces in a gate length direction and a gate width direction of a second gate electrode, fourth offset sidewalls formed on the side surfaces in the gate length and width directions of the second gate electrode with the third offset sidewalls being interposed between the fourth offset sidewalls and the second gate electrode, and second extension regions.

17 Claims, 11 Drawing Sheets

(56) References Cited

U.S. PATENT DOCUMENTS

2010/0176460 A1* 7/2010 Goto .............................. 257/392
2010/0327372 A1* 12/2010 Goto .............................. 257/392
2011/0233653 A1* 9/2011 Lee et al. ....................... 257/324

FOREIGN PATENT DOCUMENTS

| | | |
|---|---|---|
| JP | 2007-273816 A | 10/2007 |
| JP | 2009-140967 A | 6/2009 |
| JP | 2009-140967 A | 6/2009 |

* cited by examiner

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-nMIS REGION

H-nMIS REGION

L-pMIS REGION

H-pMIS REGION

L-pMIS REGION

H-pMIS REGION

L-pMIS REGION

H-pMIS REGION

FIRST MIS REGION

SECOND MIS REGION

FIRST MIS REGION

SECOND MIS REGION

SEMICONDUCTOR DEVICE

CROSS-REFERENCE TO RELATED APPLICATIONS

This is a continuation of PCT International Application PCT/JP2011/001998 filed on Apr. 4, 2011, which claims priority to Japanese Patent Application No. 2010-217600 filed on Sep. 28, 2010. The disclosures of these applications including the specifications, the drawings, and the claims are hereby incorporated by reference in their entirety.

BACKGROUND

The present disclosure relates to semiconductor devices and methods for manufacturing the semiconductor devices. More particularly, the present disclosure relates to a semiconductor device including a metal-insulator-semiconductor field-effect transistor (MISFET) having a gate electrode including a metal film, and a method for manufacturing the semiconductor device.

In recent years, due to further miniaturization of semiconductor integrated circuit devices, there has been a problem that the short channel effect (SCE) occurs, i.e., as the gate length of the gate electrode decreases, the threshold voltage of the MISFET (hereinafter referred to as a MIS transistor) decreases. To address the problem, a semiconductor device has been proposed which includes a MIS transistor having an offset sidewall (see, for example, Japanese Patent Publication No. 2003-100902).

The benefit of the offset sidewall will be described hereinafter with reference to FIGS. 28A and 28B. FIG. 28A is a cross-sectional view of a configuration of a first comparative example semiconductor device, taken along the gate length direction. FIG. 28B is a cross-sectional view of a configuration of a second comparative example semiconductor device, taken along the gate length direction.

As shown in FIG. 28A, the first comparative example semiconductor device includes a MIS transistor TrA which does not have an offset sidewall. As shown in FIG. 28B, the second comparative example semiconductor device includes a MIS transistor TrB which has an offset sidewall 53b.

As shown in FIG. 28A, the MIS transistor TrA includes a gate insulating film 51a which is formed on an active region 50x of a semiconductor substrate 50, a gate electrode 52a which is formed on the gate insulating film 51a, and extension regions 54a which are formed in the active region 50x adjacent to the channel region and extending laterally away from the channel region (hereinafter also referred to as "formed in the active region 50x laterally outside the gate electrode 52a").

As shown in FIG. 28B, the MIS transistor TrB includes a gate insulating film 51b which is formed on an active region 50x of a semiconductor substrate 50, a gate electrode 52b which is formed on the gate insulating film 51b, offset sidewalls 53b which are formed on side surfaces of the gate electrode 52b, and extension regions 54b which are formed in the active region 50x laterally outside the gate electrode 52b.

The extension regions 54a are formed as follows. An impurity is implanted into the active region 50x using the gate electrode 52a as a mask. As a result, extension implantation regions are formed in a self-alignment manner. Thereafter, the impurity contained in the extension implantation regions is activated by a thermal treatment to form the extension regions 54a.

The extension regions 54b are formed as follows. An impurity is implanted into the active region 50x using the offset sidewall 53b as a mask. As a result, extension implantation regions are formed in a self-alignment manner. Thereafter, the impurity contained in the extension implantation regions is activated by a thermal treatment to form the extension regions 54b.

The gate electrode 52a has an effective gate length Leffa represented by:

$$Leffa = La - 2 \times \Delta La$$

where La is the gate length of the gate electrode 52a, and ΔLa is an overlap length across which the extension region 54a and the gate electrode 52a overlap.

The gate electrode 52b has an effective gate length Leffb represented by:

$$Leffb = Lb + 2 \times Wb - 2 \times \Delta Lb$$

where Lb is the gate length of the gate electrode 52b, Wb is the width of the offset sidewall 53b, and ΔLb is an overlap length across which the extension region 54b, and the offset sidewall 53b and the gate electrode 52b, overlap.

If the gate length La and the gate length Lb are the same (La=Lb) and the overlap length ΔLa and the overlap length ΔLb are the same (ΔLa=ΔLb), the effective gate length Leffb is greater than the effective gate length Leffa by a length (Wb×2) which is two times as great as the width Wb (Leffb>Leffa).

Thus, the effective gate length of the gate electrode can be increased by use of the offset sidewalls.

A relationship between the gate length of the gate electrode and the threshold voltage of the MIS transistor will be described with reference to FIG. 29. FIG. 29 is a diagram showing the relationship between the gate length of the gate electrode and the threshold voltage of the MIS transistor.

As described above, the effective gate length Leffb in the presence of the offset sidewall is greater than the effective gate length Leffa in the absence of the offset sidewall by a length (Wb×2) which is two times as great as the width Wb (Leffb>Leffa).

Therefore, as shown in FIG. 29, the degree of a drop of the threshold voltage in the presence of the offset sidewall (see a thick line) is lower than that in the absence of the offset sidewall (see a thin line). In other words, the effective gate length of the gate electrode can be increased by the presence of the offset sidewall, and therefore, even if the gate length of the gate electrode decreases, the decrease of the threshold voltage of the MIS transistor can be reduced.

SUMMARY

Incidentally, when a semiconductor device includes a first MIS transistor and a second MIS transistor, the extension regions may be formed by the following process. The process will be described hereinafter with reference to FIGS. 30A and 30B and FIGS. 31A and 31B. FIGS. 30A-31B are cross-sectional views taken along the gate length showing the process of forming the extension regions in the order in which the extension regions are formed.

Initially, as shown in FIGS. 30A and 30B, a first resist pattern (not shown) which covers a first MIS region and does not cover a second MIS region is formed on a semiconductor substrate 100. Thereafter, an impurity is implanted into an active region 100b using the first resist pattern and offset sidewalls 105b as a mask. As a result, extension implantation regions 106y are formed in a self-aligned manner. Note that a reference character 100 indicates a semiconductor substrate, a reference character 101 indicates a isolation region, reference characters 102a and 102b indicate well regions, and reference characters 103a and 103b indicate gate insulating films.

Thereafter, the first resist pattern is removed by first washing. In this case, a portion of the offset sidewalls 105a and 105b is also removed by the first washing.

Next, as shown in FIGS. 31A and 31B, a second resist pattern (not shown) which does not cover the first MIS region and covers the second MIS region is formed on the semiconductor substrate 100. Thereafter, an impurity is implanted into an active region 100a using the second resist pattern and the offset sidewalls 105a as a mask. As a result, extension implantation regions 107x are formed in a self-aligned manner.

Thereafter, the second resist pattern is removed by second washing. In this case, a portion of the offset sidewalls 105a and 105b are removed by the second washing.

Thereafter, a thermal treatment is performed (not shown). As a result, the impurity contained in the extension implantation regions 107x and 106y are activated to form extension regions.

However, this process has the following problem.

In this process, as shown in FIGS. 30A and 30B, the first resist pattern is removed by the first washing after the formation of the offset sidewalls 105a. Thereafter, as shown in FIGS. 31A and 31B, the extension implantation regions 107x are formed using the offset sidewalls 105a as a mask. Therefore, the offset sidewalls 105a a portion of which has been removed by the first washing (in other words, the offset sidewalls 105a have a width smaller than the desired width) are used as a mask to form the extension implantation regions 107x. Therefore, the effective gate length of the gate electrode 105a disadvantageously decreases. Therefore, the threshold voltage of the first MIS transistor is likely to be lower than the desired threshold voltage.

The present disclosure describes implementations of a semiconductor device including a first and a second MIS transistor in which the decrease of the effective gate lengths of the first and second gate electrodes are reduced or prevented.

An example semiconductor device according to the present disclosure includes a first MIS transistor and a second MIS transistor. The first MIS transistor includes a first gate insulating film formed on a first active region of a semiconductor substrate and including a first high dielectric constant film, a first gate electrode formed on the first gate insulating film, first offset sidewalls formed on side surfaces in a gate width direction of the first gate electrode, second offset sidewalls formed on side surfaces in a gate length direction and the side surfaces of the gate width direction of the first gate electrode with the first offset sidewalls being interposed between the second offset sidewalls and the first gate electrode, and first extension regions formed in the first active region laterally outside the first gate electrode. The second MIS transistor includes a second gate insulating film formed on a second active region of the semiconductor substrate and including a second high dielectric constant film, a second gate electrode formed on the second gate insulating film, third offset sidewalls formed on side surfaces in a gate length direction and a gate width direction of the second gate electrode, fourth offset sidewalls formed on the side surfaces in the gate length and width directions of the second gate electrode with the third offset sidewalls being interposed between the fourth offset sidewalls and the second gate electrode, and second extension regions formed in the second active region laterally outside the second gate electrode. The first offset sidewalls are not formed on the side surfaces in the gate length direction of the first gate electrode.

According to the example semiconductor device of the present disclosure, the decrease of the effective gate lengths of the first and second gate electrodes can be reduced or prevented. Therefore, even if the gate lengths of the first and second gate electrodes are decreased due to further miniaturization of the semiconductor device, the decrease of the threshold voltages of the first and second MIS transistors can be reduced or prevented.

In the semiconductor device of the present disclosure, the second gate insulating film preferably has a thickness greater than that of the first gate insulating film.

In the semiconductor device of the present disclosure, the second gate insulating film preferably includes a first underlying film formed on the second active region, and the second high dielectric constant film formed on the first underlying film. The first underlying film preferably has a thickness greater than that of the second high dielectric constant film.

In the semiconductor device of the present disclosure, the first gate insulating film preferably includes a second underlying film formed on the first active region, and the first high dielectric constant film formed on the second underlying film. The second underlying film preferably has a thickness smaller than those of the first high dielectric constant film and the first underlying film.

In the semiconductor device of the present disclosure, the first gate electrode preferably has a width in the gate length direction smaller than that of the second gate electrode.

In the semiconductor device of the present disclosure, the first active region preferably has a width in the gate width direction smaller than that of the second active region.

The semiconductor device of the present disclosure preferably further includes an isolation region formed in the semiconductor substrate to surround each of the first and second active regions. The first gate electrode is preferably formed on the first active region and the isolation region. The second gate electrode is preferably formed on the second active region and the isolation region. The first gate electrode protruding above the isolation region preferably has a protrusion amount smaller than that of the second gate electrode protruding above the isolation region.

In the semiconductor device of the present disclosure, the first offset sidewall preferably has a width which is the same as that of the third offset sidewall, and the second offset sidewall preferably has a width which is smaller than or the same as that of the fourth offset sidewall.

In the semiconductor device of the present disclosure, the first offset sidewall preferably has a width greater than that of the second offset sidewall, and the third offset sidewall preferably has a width greater than that of the fourth offset sidewall.

In the semiconductor device of the present disclosure, the first extension region preferably has a diffusion depth smaller than that of the second extension region.

In the semiconductor device of the present disclosure, the first extension region preferably has an impurity concentration higher than that of the second extension region.

In the semiconductor device of the present disclosure, the first gate electrode preferably has a rectangular shape as viewed from above, and the second gate electrode preferably has a rectangular shape with rounded corners as viewed from above.

In the semiconductor device of the present disclosure, the first MIS transistor preferably has a power supply voltage lower than that of the second MIS transistor.

In the semiconductor device of the present disclosure, the first gate electrode preferably includes a first metal film formed on the first gate insulating film, and a first silicon film formed on the first metal film. The second gate electrode preferably includes a second metal film formed on the second gate insulating film, and a second silicon film formed on the second metal film.

In the semiconductor device of the present disclosure, the first gate insulating film preferably includes an adjustment metal.

In the semiconductor device of the present disclosure, the first and second MIS transistors are preferably each an n-type MIS transistor, and the adjustment metal is preferably lanthanum.

In the semiconductor device of the present disclosure, the first and second MIS transistors are preferably each a p-type MIS transistor, and the adjustment metal is preferably aluminum.

An example method for manufacturing a semiconductor device according to the present disclosure is a method for manufacturing a semiconductor device including a first MIS transistor having a first gate insulating film, a first gate electrode, first offset sidewalls, second offset sidewalls, and first extension regions formed on a first active region of a semiconductor substrate, and a second MIS transistor having a second gate insulating film, a second gate electrode, third offset sidewalls, fourth offset sidewalls, and second extension regions formed on a second active region of the semiconductor substrate. The method includes the steps of: (a) forming a film for forming a gate insulating film on the semiconductor substrate, the film for forming a gate insulating film including a high dielectric constant film; (b) forming a film for forming a gate electrode on the film for forming a gate insulating film; (c) performing patterning on the film for forming a gate electrode and the film for forming a gate insulating film to form a film for forming the first gate electrode and a film for forming the first gate insulating film which cover the first active region and have a width which is the same as a width in a gate width direction of the first gate electrode, and form, on the second active region, the second gate insulating film including the film for forming a gate insulating film, and the second gate electrode including the film for forming a gate electrode; and (d) forming a film for forming the first offset sidewalls on side surfaces in a gate width direction of the film for forming the first gate electrode, and forming the third offset sidewalls on side surfaces in a gate length direction and a gate width direction of the second gate electrode; (e) after step (d), forming the second extension regions in the second active region laterally outside the second gate electrode; (f) after step (e), performing patterning on the film for forming the first gate electrode, the film for forming the first gate insulating film, and the film for forming the first offset sidewalls to form, on the first active region, the first gate insulating film including the film for forming the first gate insulating film, and the first gate electrode including the film for forming the first gate electrode, and form the first offset sidewalls including the film for forming the first offset sidewalls on side surfaces in the gate width direction of the first gate electrode; (g) forming the second offset sidewalls on side surfaces in a gate length direction and the side surfaces in the gate width direction of the first gate electrode with the first offset sidewalls being interposed between the second offset sidewalls and the first gate electrode, and forming the fourth offset sidewalls on the side surfaces in the gate length and width directions of the second gate electrode with the third offset sidewalls being interposed between the fourth offset sidewalls and the second gate electrode; and (h) after step (g), forming the first extension regions in the first active region laterally outside the first gate electrode.

According to the example semiconductor device manufacturing method of the present disclosure, the second extension regions are formed without washing after the formation of the third offset sidewalls which are in contact with the side surfaces in the gate length direction of the second gate electrode. Therefore, the third offset sidewalls any portion of which is not removed by washing (in other words, the third offset sidewalls having the desired width) can be used as a mask to form the second extension implantation regions.

Therefore, the decrease of the effective gate length of the second gate electrode can be reduced or prevented. Therefore, even if the gate length of the second gate electrode is decreased due to further miniaturization of the semiconductor device, the decrease of the threshold voltage of the second MIS transistor can be reduced or prevented. On the other hand, the first extension regions are formed without washing after the formation of the second offset sidewalls which are in contact with the side surfaces in the gate length direction of the first gate electrode. Therefore, the second offset sidewalls any portion of which is not removed by washing (in other words, the second offset sidewalls having the desired width) can be used as a mask to form the first extension implantation regions. Therefore, the decrease of the effective gate length of the first gate electrode can be reduced or prevented. Therefore, even if the gate length of the first gate electrode is decreased due to further miniaturization of the semiconductor device, the decrease of the threshold voltage of the first MIS transistor can be reduced or prevented.

In the example semiconductor device manufacturing method of the present disclosure, the second gate insulating film preferably has a thickness greater than that of the first gate insulating film.

In the example semiconductor device manufacturing method of the present disclosure, step (e) preferably includes the steps of: (e1) implanting an impurity into the second active region using the film for forming the first gate electrode and the third offset sidewalls as a mask to form the second extension implantation regions; and (e2) after step (e1), forming the second extension regions by a thermal treatment. Step (h) preferably includes the steps of: (h1) implanting an impurity into the first active region using a resist pattern covering the second active region and the second offset sidewalls as a mask to form the first extension implantation regions; (h2) removing the resist pattern by washing; and (h3) after step (h2), forming the first extension regions by a thermal treatment.

As described above, according to the example semiconductor device of the present disclosure and the example semiconductor device manufacturing method of the present disclosure, the decrease of the effective gate lengths of the first and second gate electrodes can be reduced or prevented. Therefore, even if the gate length of the first or second gate electrode is decreased due to further miniaturization of the semiconductor device, the decrease of the threshold voltage of the first or second MIS transistor can be reduced or prevented.

DETAILED DESCRIPTION

Embodiments of the present disclosure will be described hereinafter with reference to the accompanying drawings.

(First Embodiment)

Figure 1A:
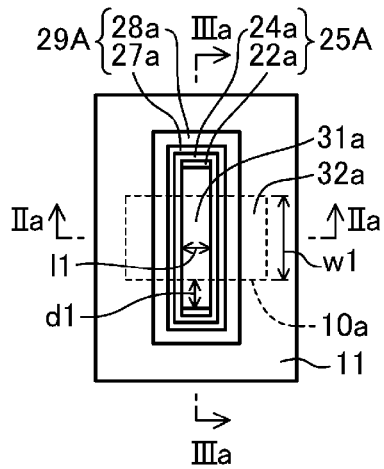
FIGS. 1A and 1B are plan views of a configuration of a semiconductor device according to a first embodiment of the present disclosure.
Figure 1B:
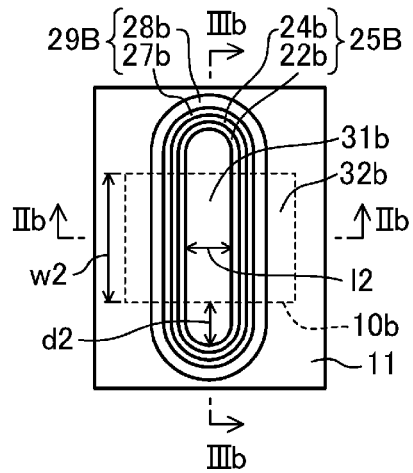
Figure 2A:
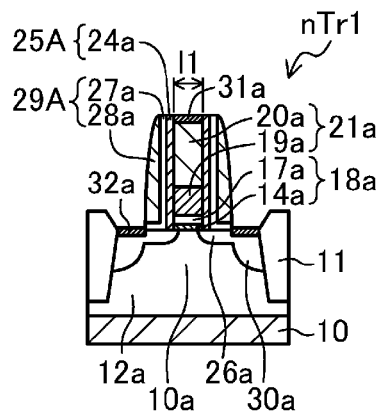
FIG. 2A is a cross-sectional view of the configuration of the semiconductor device of the first embodiment of the present disclosure, taken along line IIa-IIa of FIG. 1A in the gate length direction.
Figure 2B:
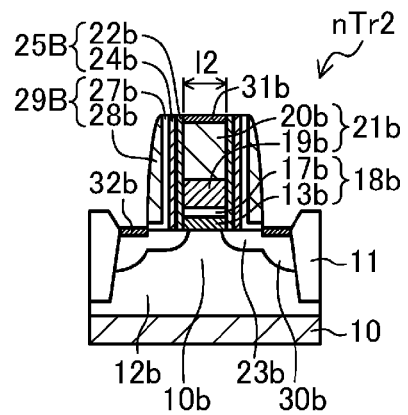
FIG. 2B is a cross-sectional view of the configuration of the semiconductor device of the first embodiment of the present disclosure, taken along line IIb-IIb of FIG. 1B in the gate length direction.
Figure 3A:
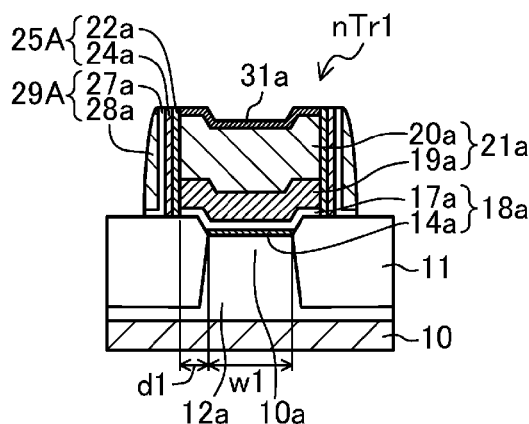
FIG. 3A is a cross-sectional view of the configuration of the semiconductor device of the first embodiment of the present disclosure, taken along line IIIa-IIIa of FIG. 1A in the gate width direction.
Figure 3B:
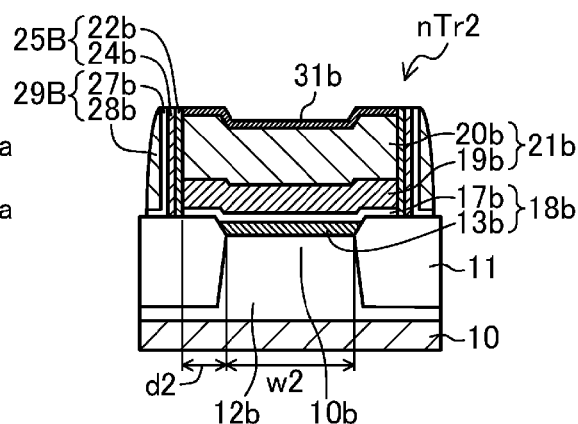
FIG. 3B is a cross-sectional view of the configuration of the semiconductor device of the first embodiment of the present disclosure, taken along line IIIb-IIIb of FIG. 1B in the gate width direction.
Figure 4A:
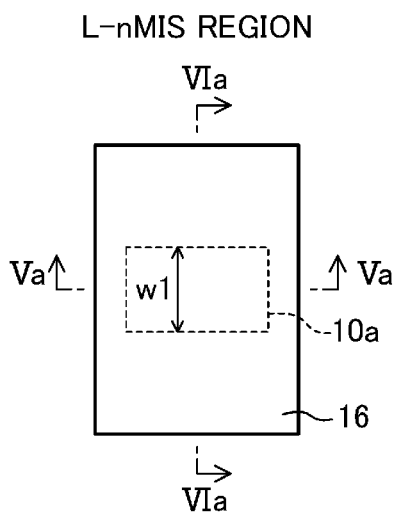
FIGS. 4A and 4B are plan views showing a method for manufacturing the semiconductor device of the first embodiment of the present disclosure.
Figure 4B:
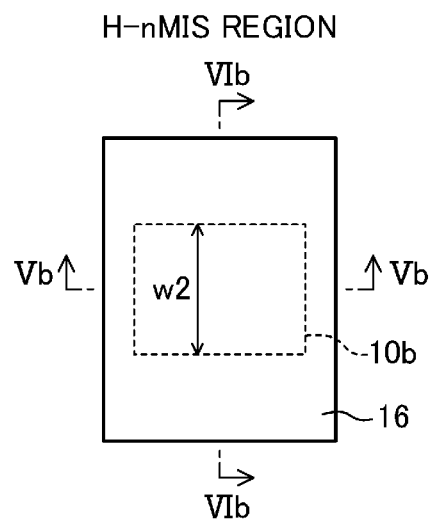
Figure 5A:
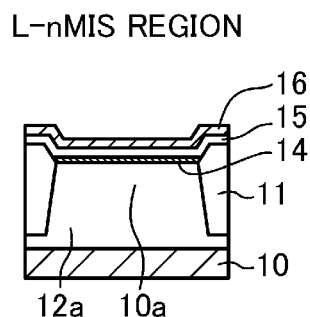
FIG. 5A is a cross-sectional view showing the method for manufacturing the semiconductor device of the first embodiment of the present disclosure, taken along line Va-Va of FIG. 4A in the gate length direction.
Figure 5B:
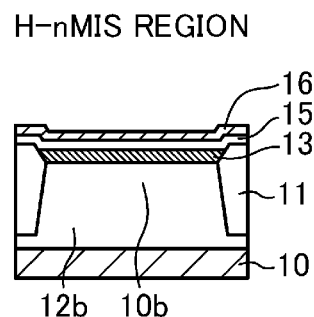
FIG. 5B is a cross-sectional view showing the method for manufacturing the semiconductor device of the first embodiment of the present disclosure, taken along line Vb-Vb of FIG. 4B in the gate length direction.
Figure 6A:
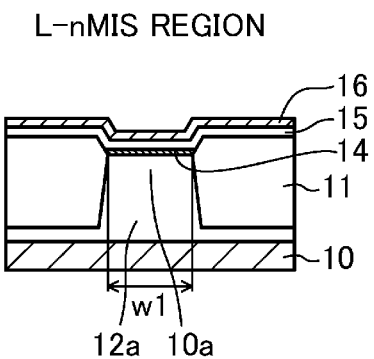
FIG. 6A is a cross-sectional view showing the method for manufacturing the semiconductor device of the first embodiment of the present disclosure, taken along line VIa-VIa of FIG. 4A in the gate width direction.
Figure 6B:
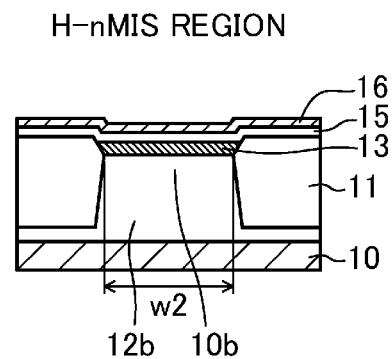
FIG. 6B is a cross-sectional view showing the method for manufacturing the semiconductor device of the first embodiment of the present disclosure, taken along line VIb-VIb of FIG. 4B in the gate width direction.

A semiconductor device according to a first embodiment of the present disclosure will be described hereinafter with reference to FIGS. 1A and 1B, 2A and 2B, and 3A and 3B. FIGS. 1A and 1B are plan views of a configuration of the semiconductor device of the first embodiment of the present disclosure. FIGS. 2A and 2B are cross-sectional views of a configuration of the semiconductor device of the first embodiment of the present disclosure, taken along the gate length direction. FIGS. 3A and 3B are cross-sectional views of a configuration of the semiconductor device of the first embodiment of the present disclosure, taken along the gate width direction. An "L-nMIS region" shown in FIGS. 1A-3A and FIGS. 4A-24A (described below) refers to a region in which a low-voltage n-type MIS transistor is formed. An "H-nMIS region" shown in FIGS. 1B-3B and FIGS. 4B-24B (described below) refers to a region in which a high-voltage n-type MIS transistor is formed.

As shown in FIGS. 1A-3A, the semiconductor device of this embodiment includes a low-voltage n-type MIS transistor nTr1 (first MIS transistor) and a high-voltage n-type MIS transistor nTr2 (second MIS transistor). A power supply voltage to the low-voltage n-type MIS transistor nTr1 is, for example, 1.0 V. A power supply voltage to the high-voltage n-type MIS transistor nTr2 is, for example, 1.8 V.

As shown in FIGS. 1A-3A, the low-voltage n-type MIS transistor nTr1 includes a gate insulating film 18a (first gate insulating film) formed on an active region 10a (first active region), a gate electrode 21a (first gate electrode) formed on the gate insulating film 18a, inner offset sidewalls 22a (first offset sidewalls) formed on side surfaces in the gate width direction of the gate electrode 21a, outer offset sidewalls 24a (second offset sidewalls) formed on side surfaces in the gate length direction and the side surfaces in the gate width direction of the gate electrode 21a with the inner offset sidewalls 22a being interposed between the outer offset sidewalls 24a and the gate electrode 21a, n-type extension regions 26a (first extension regions) formed in the active region 10a adjacent to the channel region and extending laterally away from the channel region (hereinafter also referred to as "formed in the active region 10a laterally outside the gate electrode 21a"), sidewalls 29A formed on the side surfaces in the gate length and width directions of the gate electrode 21a with the offset sidewalls 25A being interposed between the sidewalls 29A and the gate electrode 21a, n-type source/drain regions 30a formed in the active region 10a adjacent to the respective n-type extension regions 26a and extending laterally away from the respective n-type extension regions 26a (hereinafter also referred to as "formed in the active region 10a laterally outside the sidewalls 29A"), a silicide film 31a formed on the gate electrode 21a, and a silicide film 32a formed on the n-type source/drain regions 30a.

As shown in FIGS. 1B-3B, the high-voltage n-type MIS transistor nTr2 includes a gate insulating film 18b (second gate insulating film) formed on an active region 10b (second active region), a gate electrode 21b (second gate electrode) formed on the gate insulating film 18b, inner offset sidewalls 22b (third offset sidewalls) formed on side surfaces in the gate length and width directions of the gate electrode 21b, outer offset sidewalls 24b (fourth offset sidewalls) formed on the side surfaces in the gate length and width directions of the gate electrode 21b with the inner offset sidewalls 22b being interposed between the outer offset sidewalls 24b and the gate electrode 21b, n-type extension regions 23b (second extension regions) formed in the active region 10b laterally outside the gate electrode 21b, sidewalls 29B formed on the side surfaces in the gate length and width directions of the gate electrode 21b with the offset sidewalls 25B being interposed between the sidewalls 29B and the gate electrode 21b, n-type source/drain regions 30b formed in the active region 10b laterally outside the sidewalls 29B, a silicide film 31b formed on the gate electrode 21b, and a silicide film 32b formed on the n-type source/drain regions 30b.

As shown in FIGS. 2A and 3A, the gate insulating film 18a includes an underlying film 14a and a high dielectric constant film (high-k film) 17a containing an adjustment metal (e.g., lanthanum (La)). As shown in FIGS. 2B and 3B, the gate insulating film 18b includes an underlying film 13b and a high-k film 17b containing an adjustment metal (e.g., La).

The underlying film 14a has a thickness (e.g., 0.7 nm) smaller than that (e.g., 3.0 nm) of the underlying film 13b. The high-k film 17a has the same thickness as that of the high-k film 17b. Therefore, the gate insulating film 18a has a thickness smaller than that of the gate insulating film 18b.

The thickness (e.g., 0.7 nm) of the underlying film 14a is smaller than those (e.g., 1.5 nm) of the high-k films 17a and 17b. On the other hand, the thickness (e.g., 3.0 nm) of the underlying film 13b is greater than those (e.g., 1.5 nm) of the high-k films 17a and 17b.

As shown in FIGS. 2A and 3A, the gate electrode 21a includes a metal film 19a and a silicon film 20a. As shown in FIGS. 2B and 3B, the gate electrode 21b includes a metal film 19b and a silicon film 20b.

As shown in FIG. 1A, the gate electrode 21a has, for example, a rectangular shape as viewed from above. As shown in FIG. 1B, the gate electrode 21b has a rectangular shape with rounded corners as viewed from above. In other words, the gate electrode 21b has a rectangular portion and semicircular portions connected to ends of the rectangular portion as viewed from above.

A gate length l1 (see FIGS. 1A and 2A; e.g., 30 nm) of the gate electrode 21a is smaller than a gate length l2 (see FIGS. 1B and 2B; e.g., 150 nm) of the gate electrode 21b. The gate length of the gate electrode 21a, 21b refers to the width in the gate length direction of the gate electrode 21a, 21b.

A gate width w1 (see FIGS. 1A and 3A; e.g., 150 nm) of the active region 10a is smaller than a gate width w2 (see FIGS. 1B and 3B; e.g., 300 nm) of the active region 10b. The gate width of the active region 10a, 10b refers to the width in the gate width direction of the surface of the active region 10a, 10b.

A protrusion amount d1 (see FIGS. 1A and 3A; e.g., 100 nm) of the gate electrode 21a protruding above an isolation region 11 is smaller than a protrusion amount d2 (see FIGS. 1B and 3B; e.g., 200 nm) of the gate electrode 21b protruding above the isolation region 11. The protrusion amount d1, d2 refers to an amount from one end in the gate width direction of the active region 10a, 10b to one end (side surface) in the gate width direction of the gate electrode 21a, 21b.

The inner offset sidewall 22a has the same width as that of the inner offset sidewall 22b.

The outer offset sidewall 24a has a width which is smaller than or the same as that of the outer offset sidewall 24b.

The inner offset sidewall 22a has a width greater than that of the outer offset sidewall 24a. The inner offset sidewall 22b has a width greater than that of the outer offset sidewall 24b.

The n-type extension region 26a has a diffusion depth smaller than that of the n-type extension region 23b. The n-type extension region 26a has an n-type impurity concentration higher than that of the n-type extension region 23b. The diffusion depth of the n-type extension region 26a, 23b refers to a depth from the surface of the active region 10a, 10b to the junction surface of the n-type extension region 26a, 23b.

As shown in FIGS. 2A-3B, the sidewalls 29A and 29B include inner sidewalls 27a and 27b having an L-shaped cross-section and outer sidewalls 28a and 28b, respectively. The sidewall 29A has the same width as that of the sidewall 29B.

The n-type source/drain region 30a has the same diffusion depth as that of the n-type source/drain region 30b. The n-type source/drain region 30a has the same n-type impurity concentration as that of the n-type source/drain region 30b.

A method for manufacturing the semiconductor device of the first embodiment of the present disclosure will be described with reference to FIGS. 4A-24B. FIGS. 4A and 4B, 7A and 7B, 10A and 10B, 13A and 13B, 16A and 16B, 19A and 19B, and 22A and 22B are plan views showing the method for manufacturing the semiconductor device of the first embodiment of the present disclosure in the order in which the semiconductor device is manufactured. FIGS. 5A and 5B, 8A and 8B, 11A and 11B, 14A and 14B, 17A and 17B, 20A and 20B, and 23A and 23B are cross-sectional views showing the method for manufacturing the semiconductor device of the first embodiment of the present disclosure in the order in which the semiconductor device is manufactured, taken along the gate length direction. FIGS. 6A and 6B, 9A and 9B, 12A and 12B, 15A and 15B, 18A and 18B, 21A and 21B, and 24A and 24B are cross-sectional views showing the method for manufacturing the semiconductor device of the first embodiment of the present disclosure in the order in which the semiconductor device is manufactured, taken along the gate width direction.

Initially, as shown in FIGS. 4A-6B, the isolation region 11 is formed in an upper portion of the semiconductor substrate 10 formed, for example, of silicon, for example, by shallow trench isolation (STI). As a result, the active region 10a surrounded by the isolation region 11 is formed in the L-nMIS region of the semiconductor substrate 10. In addition, the active region 10b surrounded by the isolation region 11 is formed in the H-nMIS region of the semiconductor substrate 10.

The gate width w1 of the active region 10a is, for example, 150 nm. The gate width w2 of the active region 10b is, for example, 300 nm.

Thereafter, as shown in FIGS. 4A-6B, a p-type well region 12a is formed in the L-nMIS region of the semiconductor substrate 10. In addition, a p-type well region 12b is formed in the H-nMIS region of the semiconductor substrate 10.

Next, as shown in FIGS. 4A-6B, an underlying film 13 formed, for example, of silicon oxide having a thickness of 3.0 nm is formed on the active region 10b, for example, by thermal oxidation. Thereafter, an underlying film 14 formed, for example, of silicon oxide having a thickness of 0.7 nm is formed on the active region 10a, for example, by thermal oxidation.

Next, as shown in FIGS. 4A-6B, a high-k film 15 having a thickness of, for example, 1.5 nm is formed on the semiconductor substrate 10. Examples of a material for the high-k film 15 include metal oxides having a relative dielectric constant of, for example, eight or more, specifically, hafnium oxides, such as HfSiO, HfSiON, HfO, HfON, HfZrO, HfZrON, etc. Thereafter, an adjustment metal film 16 containing an adjustment metal is formed on the high-k film 15. The adjustment metal is, for example, La.

Next, as shown in FIGS. 7A-9B, the adjustment metal contained in the adjustment metal film 16 is introduced into the high-k film 15 by a thermal treatment. As a result, a high-k film 17 containing the adjustment metal is formed. Thereafter, an unreacted portion (in other words, a portion left on the high-k film 17) of the adjustment metal film 16 is removed, for example, by wet etching.

Thus, as shown in FIGS. 7A-9A, a film 18 for forming a gate insulating film which includes the underlying film 13 or 14 and the high-k film 17 is formed.

Next, as shown in FIGS. 7A-9B, a metal film 19 formed, for example, of titanium nitride (TiN) or tantalum nitride (TaN) having a thickness of 10 nm is formed on the film 18 for forming a gate insulating film, for example, by chemical vapor deposition (CVD). Thereafter, a silicon film 20 formed, for example, of polysilicon having a thickness of 60 nm is formed on the metal film 19, for example, by CVD.

Thus, a film 21 for forming a gate electrode which includes the metal film 19 and the silicon film 20 is formed on the film 18 for forming a gate insulating film.

Next, as shown in FIGS. 7A-9B, a resist pattern Re1 is formed on a portion located in the L-nMIS region of the film 21 for forming a gate electrode by photolithography. In addition, a resist pattern Re2 is formed on a portion located in the H-nMIS region of the film 21 for forming a gate electrode by photolithography.

As shown in FIGS. 7A-9A, the resist pattern Re1 covers a portion located above the active region 10a of the film 21 for forming a gate electrode.

As shown in FIGS. 7A-9A, one end in the gate width direction of the resist pattern Re1 protrudes above the isolation region 11 from one end in the gate width direction of the active region 10a. The protrusion amount Dr1 is, for example, 100 nm. The protrusion amount Dr1 is the same as that of the gate electrode protruding above the isolation region 11 (see d1 in FIGS. 16A and 18A described below).

A width in the gate width direction of the resist pattern Re1 is the same as that of the gate electrode (see 21a in FIGS. 16A-18A described below).

As shown in FIGS. 7B-9B, one end in the gate width direction of the resist pattern Re2 protrudes above the isolation region 11 from one end in the gate width direction of the active region 10b. The protrusion amount Dr2 is, for example, 200 nm. The protrusion amount Dr2 is the same as that of the gate electrode protruding above the isolation region 11 (see d2 in FIGS. 10B and 12B).

A width Lr2 in the gate length direction of the resist pattern Re2 is, for example, 150 nm. The width Lr2 is the same as the gate length of the gate electrode (see 12 in FIGS. 10B and 11B).

A width in the gate width direction of the resist pattern Re2 is the same as that of the gate electrode (see 21b in FIGS. 10B-12B).

Figure 7A:
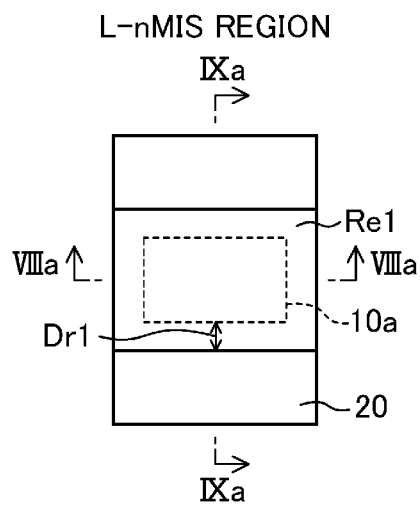
FIGS. 7A and 7B are plan views showing the method for manufacturing the semiconductor device of the first embodiment of the present disclosure.
Figure 7B:
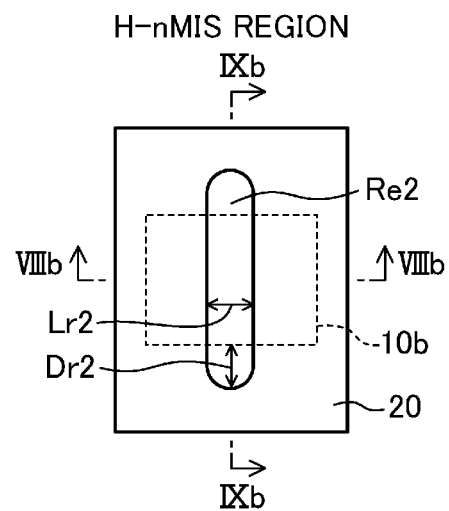
Figure 8A:
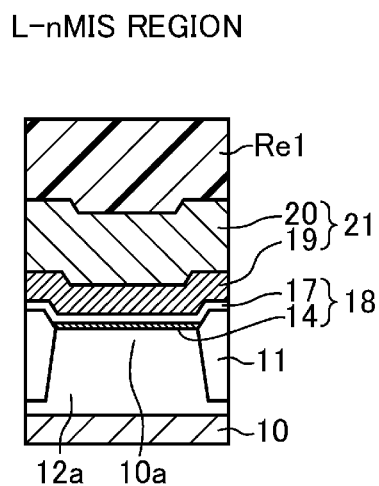
FIG. 8A is a cross-sectional view showing the method for manufacturing the semiconductor device of the first embodiment of the present disclosure, taken along line VIIIa-VIIIa of FIG. 7A in the gate length direction.
Figure 8B:
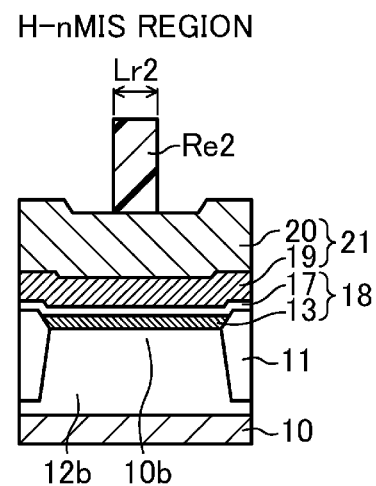
FIG. 8B is a cross-sectional view showing the method for manufacturing the semiconductor device of the first embodiment of the present disclosure, taken along line VIIIb-VIIIb of FIG. 7B in the gate length direction.
Figure 9A:
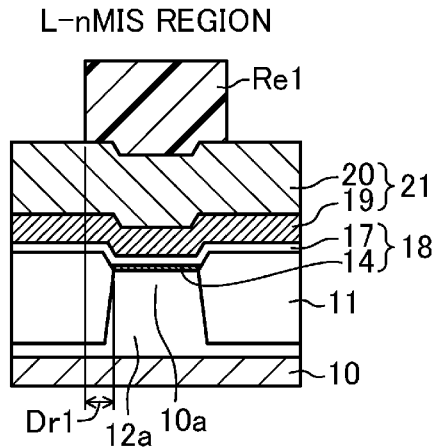
FIG. 9A is a cross-sectional view showing the method for manufacturing the semiconductor device of the first embodiment of the present disclosure, taken along line IXa-IXa of FIG. 7A in the gate width direction.
Figure 9B:
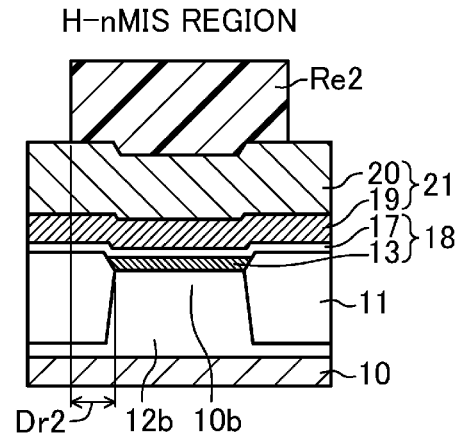
FIG. 9B is a cross-sectional view showing the method for manufacturing the semiconductor device of the first embodiment of the present disclosure, taken along line IXb-IXb of FIG. 7B in the gate width direction.
Figure 10A:
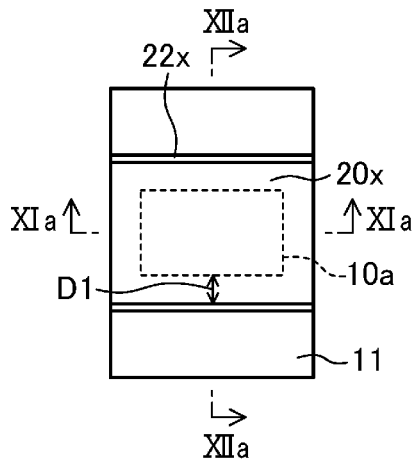
FIGS. 10A and 10B are plan views showing the method for manufacturing the semiconductor device of the first embodiment of the present disclosure.

As shown in FIG. 7B, due to the resolution of photolithography, the resist pattern Re2 has a rectangular shape with rounded corners instead of a rectangular shape with sharp corners, as viewed from above. Therefore, as shown in FIG. 10A described below, the gate electrode formed by patterning using the resist pattern Re2 as a mask has a rectangular shape with rounded corners as viewed from above, as with the resist pattern Re2.

Next, as shown in FIGS. 10A-12B, patterning is performed on the film 21 for forming a gate electrode and the film 18 for forming a gate insulating film successively, for example, by dry etching using the resist patterns Re1 and Re2 as a mask. As a result, a film 18x for forming a gate insulating film (film for forming the first gate insulating film) and a film 21x for forming a gate electrode (film for forming the first gate electrode) which cover the active region 10a are formed. In addition, the gate insulating film 18b (second gate insulating film) and the gate electrode 21b (second gate electrode) are successively formed on the active region 10b. The film 18x for forming a gate insulating film includes an underlying film 14x and a high-k film 17x. The film 21x for forming a gate electrode includes a metal film 19x and a silicon film 20x. The gate insulating film 18b includes the underlying film 13b and the high-k film 17b. The gate electrode 21b includes the metal film 19b and the silicon film 20b.

As shown in FIGS. 10A-12A, one end in the gate width direction of the film 21x for forming a gate electrode protrudes above the isolation region 11 from one end in the gate width direction of the active region 10a. The protrusion amount D1 from the one end in the gate width direction of the active region 10a to the one end in the gate width direction of the film 21x for forming a gate electrode is the same as the protrusion amount Dr1 (see FIGS. 7A and 9A) and is, for example, 100 nm. The protrusion amount D1 is the same as that of the gate electrode protruding above the isolation region 11 (see d1 in FIGS. 16A and 18A described below).

A width in the gate width direction of the film 21x for forming a gate electrode is the same as that of the gate electrode (see 21a in FIGS. 16A-18A described below).

As shown in FIGS. 10B-12B, one end in the gate width direction of the gate electrode 21b protrudes above the isolation region 11 from one end in the gate width direction of the active region 10b. The protrusion amount d2 of the gate electrode 21b protruding above the isolation region 11 is the same as the protrusion amount Dr2 (see FIGS. 7B and 9B) and is, for example, 200 nm.

The gate length l2 of the gate electrode 21b is the same as the width Lr2 (see FIGS. 7B and 8B) and is, for example, 150 nm.

Thereafter, the resist patterns Re1 and Re2 are removed.

Next, as shown in FIGS. 10A-12B, a film for forming inner offset sidewalls formed, for example, of silicon nitride (SiN) having a thickness of 5 nm is formed on an entire surface of the semiconductor substrate 10, for example, by atomic layer deposition (ALD). Thereafter, for example, anisotropic dry etching is performed on the film for forming inner offset sidewalls. As a result, a film 22x for forming inner offset sidewalls (film for forming the first offset sidewalls) is formed on side surfaces in the gate width direction of the film 21x for forming a gate electrode. In addition, the inner offset sidewalls 22b (third offset sidewalls) are formed on the side surfaces in the gate length and width directions of the gate electrode 21b.

The film 22x for forming inner offset sidewalls and the inner offset sidewalls 22b have a width of, for example, 5 nm.

Next, as shown in FIGS. 10A-12B, an n-type impurity (e.g., arsenic (As), etc.) is implanted into the active region 10b using the film 21x for forming a gate electrode and the inner offset sidewalls 22b as a mask, for example, at an implantation energy of 10 keV and a dose of $2 \times 10^{14}$ $cm^{-2}$. As a result, n-type extension implantation regions 23y are formed in a self-aligned manner.

In this embodiment, the n-type extension implantation regions 23y are formed without washing after the formation of the inner offset sidewalls 22b which are in contact with the side surfaces in the gate length direction of the gate electrode 21b. Therefore, the inner offset sidewalls 22b any portion of which is not removed by washing (in other words, the inner offset sidewalls 22b having the desired width (e.g., 5 nm)) can be used as a mask to form the n-type extension implantation regions 23y. Therefore, the decrease of the effective gate length of the gate electrode 21b can be reduced or prevented.

In this embodiment, the active region 10a is covered by the film 21x for forming a gate electrode. Therefore, the n-type extension implantation regions 23y can be formed using the film 21x for forming a gate electrode as a mask instead of a resist pattern covering the L-nMIS region. Therefore, the resist pattern does not have to be formed before the formation of the n-type extension implantation regions 23y, and washing for removing the resist pattern does not have to be performed after the formation of the n-type extension implantation regions 23y.

Next, as shown in FIGS. 13A-15B, a thermal treatment is performed, for example, at 800° C. for 30 sec. As a result, the n-type impurity contained in the n-type extension implantation regions 23y is diffused to form the n-type extension regions 23b (second extension regions) overlapping the gate electrode 21b. Thus, by performing a thermal treatment at a relatively low temperature (e.g., 800° C.), mainly, the n-type extension regions 23b are allowed to overlap the gate electrode 21b. On the other hand, as shown in FIGS. 22A-24B described below, by performing a thermal treatment at a relatively high temperature (e.g., 1000° C.), mainly, the n-type impurity contained in the n-type extension regions 23b is activated.

Next, as shown in FIGS. 13A-15B, a resist pattern Re3 is formed on the film 21x for forming a gate electrode and the isolation region 11 by photolithography. In addition, a resist pattern Re4 is formed on an entire surface of the H-nMIS region of the semiconductor substrate 10.

As shown in FIGS. 13A-15A, one end in the gate width direction of the resist pattern Re3 protrudes above the isolation region 11 from a side surface of the film 22x for forming inner offset sidewalls.

A width Lr3 in the gate length direction of the resist pattern Re3 is, for example, 30 nm. The width Lr3 is the same as the gate length of the gate electrode (see l1 in FIGS. 16A and 17A described below).

Next, as shown in FIGS. 16A-18B, patterning is performed on the film 21x for forming a gate electrode, the film 18x for forming a gate insulating film, and the film 22x for forming inner offset sidewalls, for example, by dry etching using the resist patterns Re3 and Re4 as a mask. As a result, the gate insulating film 18a (first gate insulating film) and the gate electrode 21a (first gate electrode) are successively formed on the active region 10a. In addition, the inner offset sidewalls 22a (first offset sidewalls) are formed on the side surfaces in the gate width direction of the gate electrode 21a. The gate insulating film 18a includes the underlying film 14a and the high-k film 17a. The gate electrode 21a includes the metal film 19a and the silicon film 20a.

The gate length l1 of the gate electrode 21a is the same as the width Lr3 (see FIGS. 13A and 14A) and is, for example, 30 nm.

The protrusion amount d1 of the gate electrode 21a protruding above the isolation region 11 is the same as the protrusion amount Dr1 (see FIGS. 7A and 9A) and the protrusion amount D1 (see FIGS. 10A and 12A) and is, for example, 100 nm.

In this embodiment, as shown in FIGS. 7A-12B, patterning is performed on the film 21 for forming a gate electrode and the film 18 for forming a gate insulating film successively, to form the film 18x for forming a gate insulating film and the film 21x for forming a gate electrode successively, and the gate insulating film 18b and the gate electrode 21b successively. Thereafter, as shown in FIGS. 13A-18B, patterning is performed on the film 21x for forming a gate electrode and the film 18x for forming a gate insulating film successively to form the gate insulating film 18a and the gate electrode 21a successively.

Figure 10B:
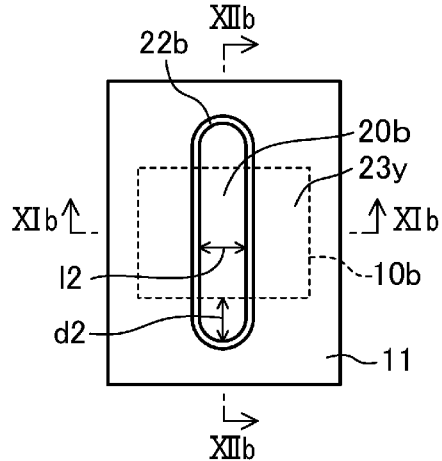
Figure 11A:
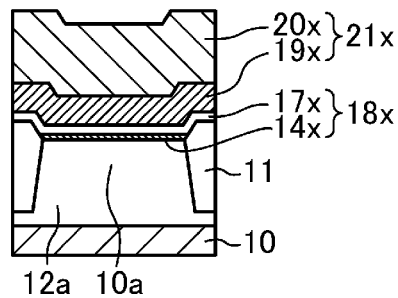
FIG. 11A is a cross-sectional view showing the method for manufacturing the semiconductor device of the first embodiment of the present disclosure, taken along line XIa-XIa of FIG. 10A in the gate length direction.
Figure 11B:
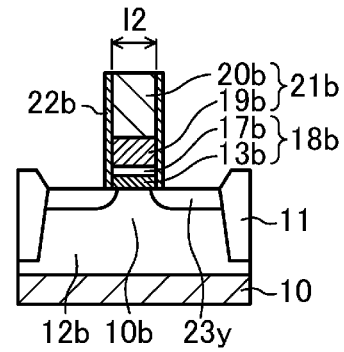
FIG. 11B is a cross-sectional view showing the method for manufacturing the semiconductor device of the first embodiment of the present disclosure, taken along line XIb-XIb of FIG. 10B in the gate length direction.
Figure 12A:
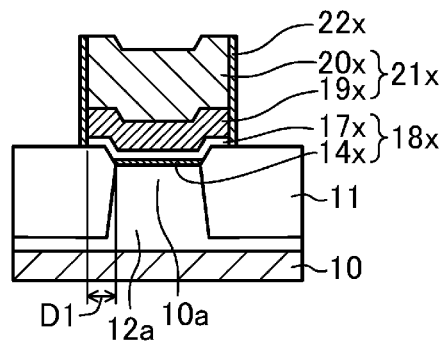
FIG. 12A is a cross-sectional view showing the method for manufacturing the semiconductor device of the first embodiment of the present disclosure, taken along line XIIa-XIIa of FIG. 10A in the gate width direction.
Figure 12B:
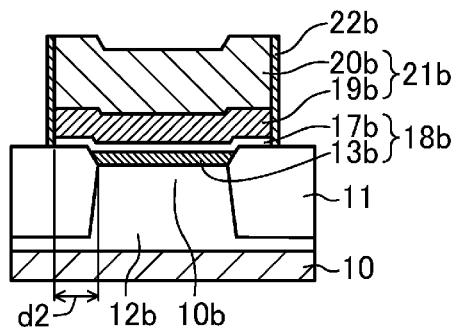
FIG. 12B is a cross-sectional view showing the method for manufacturing the semiconductor device of the first embodiment of the present disclosure, taken along line XIIb-XIIb of FIG. 10B in the gate width direction.
Figure 13A:
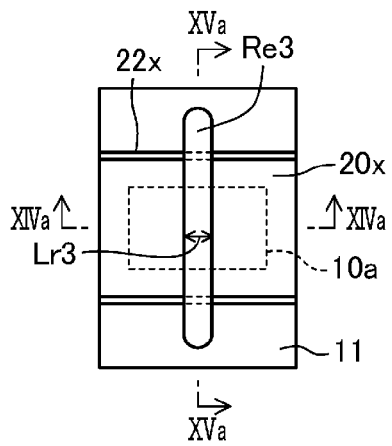
FIGS. 13A and 13B are plan views showing the method for manufacturing the semiconductor device of the first embodiment of the present disclosure.
Figure 13B:
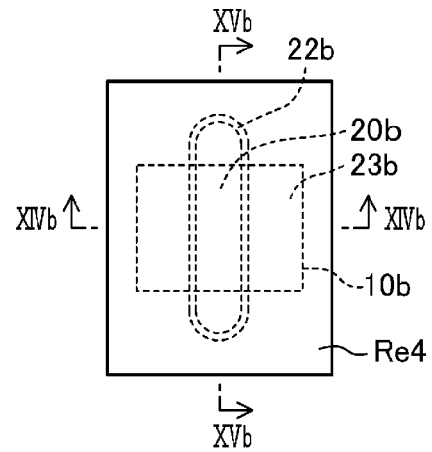
Figure 14A:
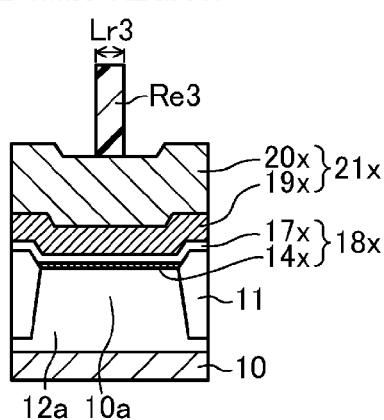
FIG. 14A is a cross-sectional view showing the method for manufacturing the semiconductor device of the first embodiment of the present disclosure, taken along line XIVa-XIVa of FIG. 13A in the gate length direction.
Figure 14B:
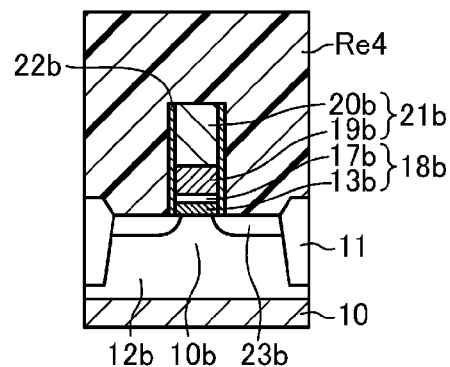
FIG. 14B is a cross-sectional view showing the method for manufacturing the semiconductor device of the first embodiment of the present disclosure, taken along line XIVb-XIVb of FIG. 13B in the gate length direction.
Figure 15A:
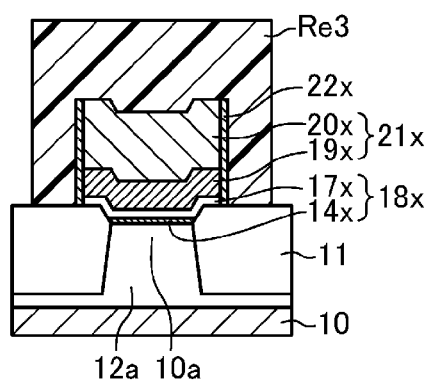
FIG. 15A is a cross-sectional view showing the method for manufacturing the semiconductor device of the first embodiment of the present disclosure, taken along line XVa-XVa of FIG. 13A in the gate width direction.
Figure 15B:
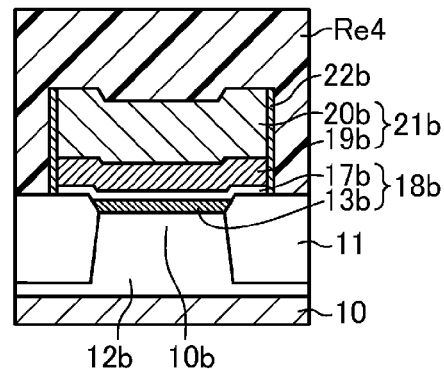
FIG. 15B is a cross-sectional view showing the method for manufacturing the semiconductor device of the first embodiment of the present disclosure, taken along line XVb-XVb of FIG. 13B in the gate width direction.
Figure 16A:
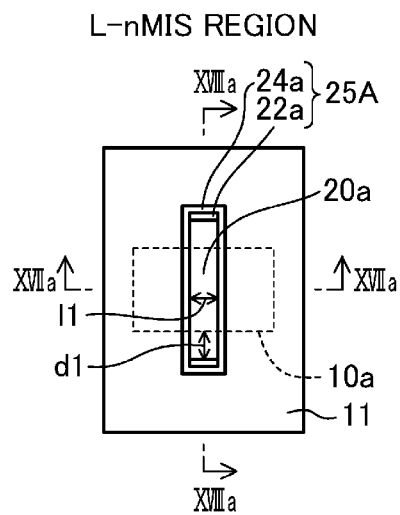
FIGS. 16A and 16B are plan views showing the method for manufacturing the semiconductor device of the first embodiment of the present disclosure.
Figure 16B:
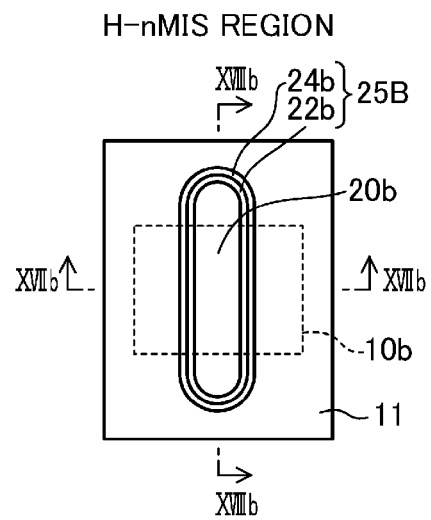
Figure 17A:
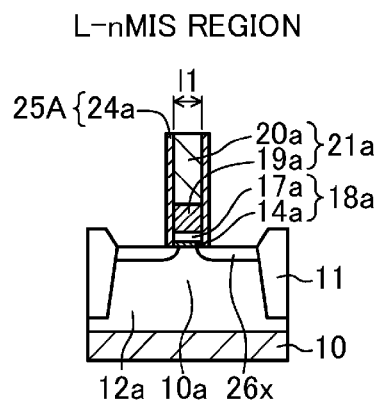
FIG. 17A is a cross-sectional view showing the method for manufacturing the semiconductor device of the first embodiment of the present disclosure, taken along line XVIIa-XVIIa of FIG. 16A in the gate length direction.
Figure 17B:
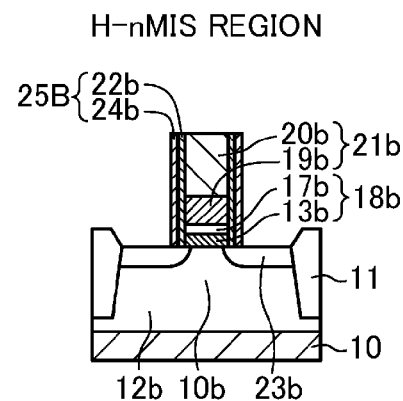
FIG. 17B is a cross-sectional view showing the method for manufacturing the semiconductor device of the first embodiment of the present disclosure, taken along line XVIIb-XVIIb of FIG. 16B in the gate length direction.
Figure 18A:
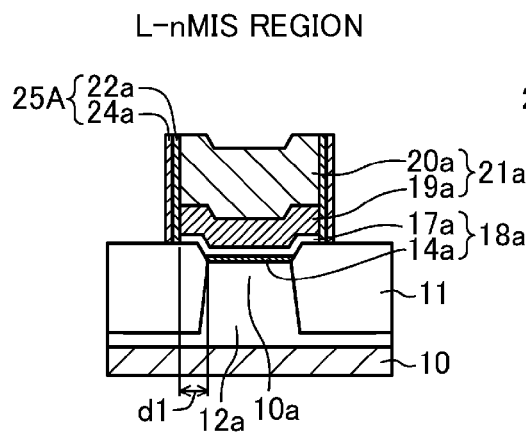
FIG. 18A is a cross-sectional view showing the method for manufacturing the semiconductor device of the first embodiment of the present disclosure, taken along line XVIIIa-XVIIIa of FIG. 16A in the gate width direction.
Figure 18B:
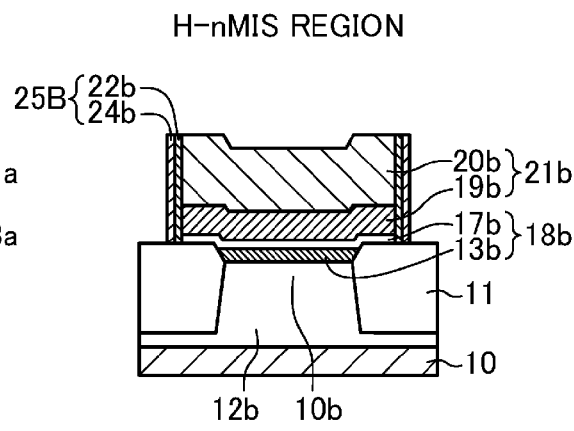
FIG. 18B is a cross-sectional view showing the method for manufacturing the semiconductor device of the first embodiment of the present disclosure, taken along line XVIIIb-XVIIIb of FIG. 16B in the gate width direction.
Figure 19A:
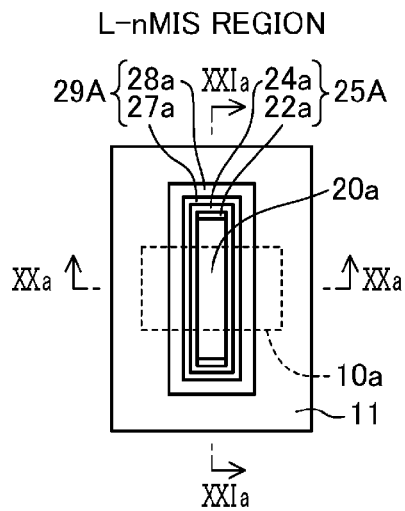
FIGS. 19A and 19B are plan views showing the method for manufacturing the semiconductor device of the first embodiment of the present disclosure.
Figure 19B:
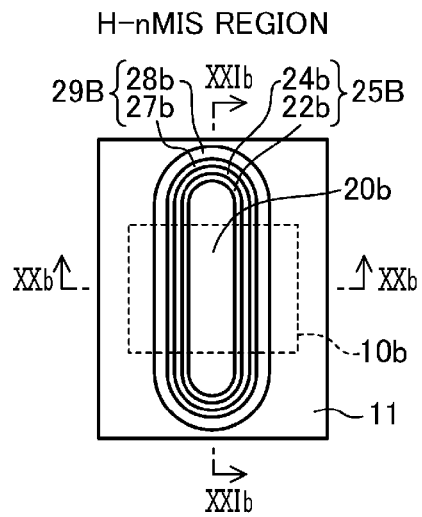
Figure 20A:
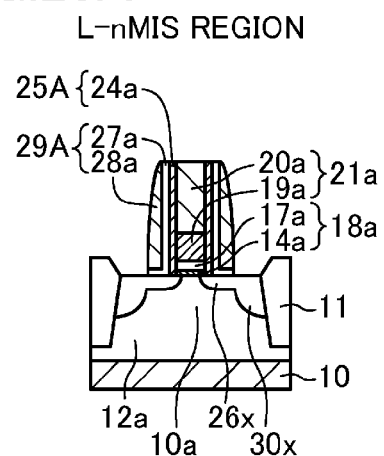
FIG. 20A is a cross-sectional view showing the method for manufacturing the semiconductor device of the first embodiment of the present disclosure, taken along line XXa-XXa of FIG. 19A in the gate length direction.
Figure 20B:
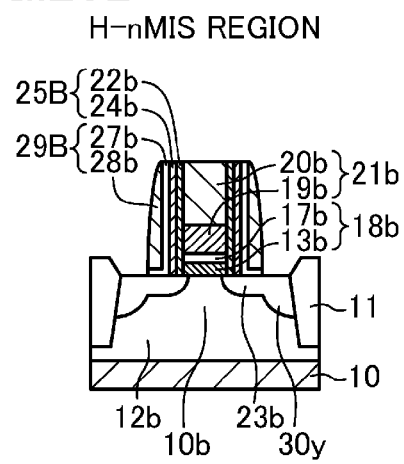
FIG. 20B is a cross-sectional view showing the method for manufacturing the semiconductor device of the first embodiment of the present disclosure, taken along line XXb-XXb of FIG. 19B in the gate length direction.
Figure 21A:
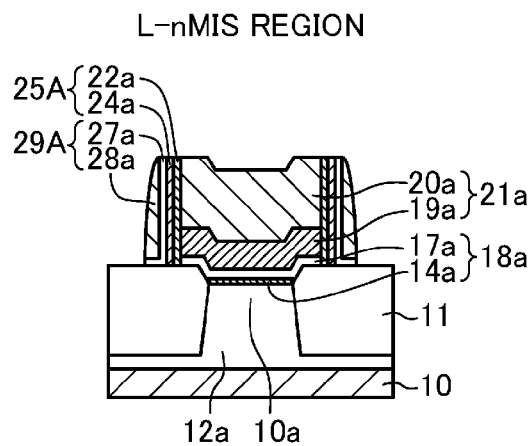
FIG. 21A is a cross-sectional view showing the method for manufacturing the semiconductor device of the first embodiment of the present disclosure, taken along line XXIa-XXIa of FIG. 19A in the gate width direction.
Figure 21B:
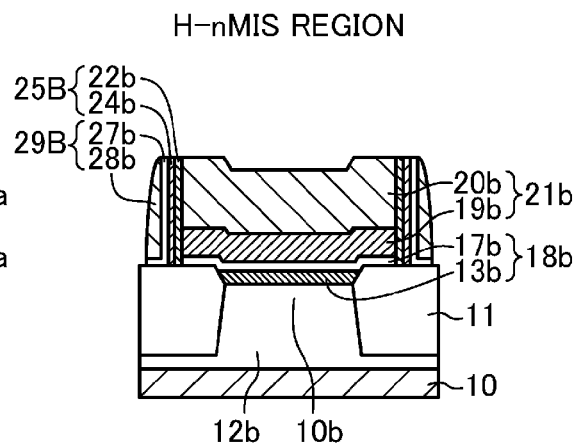
FIG. 21B is a cross-sectional view showing the method for manufacturing the semiconductor device of the first embodiment of the present disclosure, taken along line XXIb-XXIb of FIG. 19B in the gate width direction.
Figure 22A:
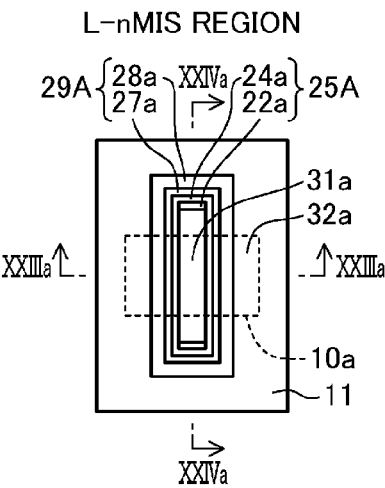
FIGS. 22A and 22B are plan views showing the method for manufacturing the semiconductor device of the first embodiment of the present disclosure.
Figure 22B:
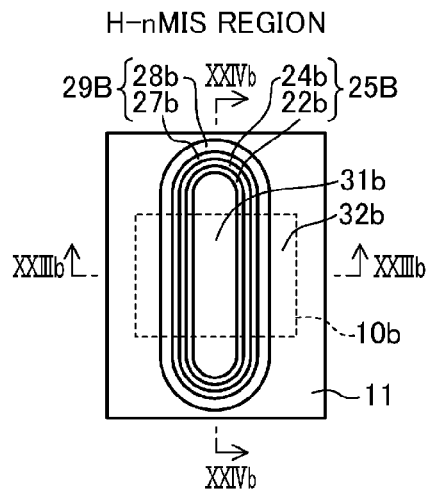
Figure 23A:
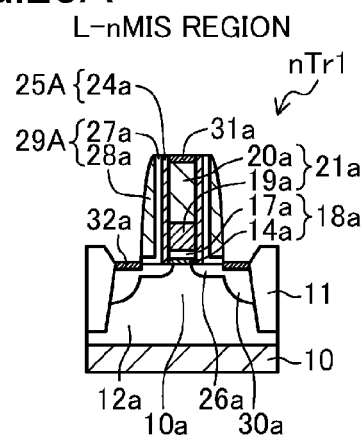
FIG. 23A is a cross-sectional view showing the method for manufacturing the semiconductor device of the first embodiment of the present disclosure, taken along line XXIIIa-XXIIIa of FIG. 22A in the gate length direction.
Figure 23B:
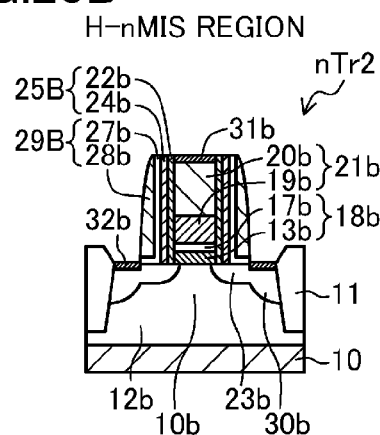
FIG. 23B is a cross-sectional view showing the method for manufacturing the semiconductor device of the first embodiment of the present disclosure, taken along line XXIIIb-XXIIIb of FIG. 22B in the gate length direction.
Figure 24A:
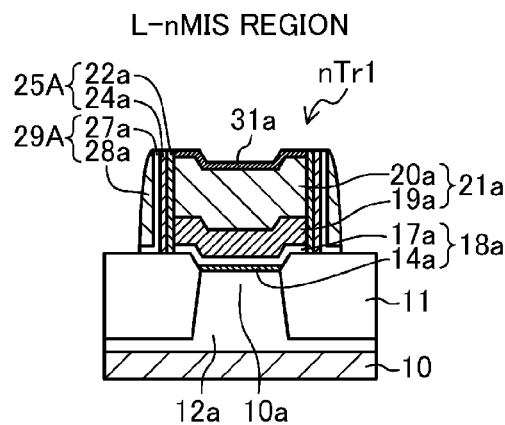
FIG. 24A is a cross-sectional view showing the method for manufacturing the semiconductor device of the first embodiment of the present disclosure, taken along line XXIVa-XXIVa of FIG. 22A in the gate width direction.
Figure 24B:
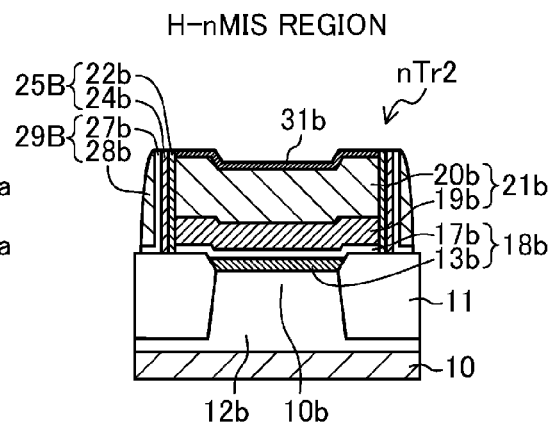
FIG. 24B is a cross-sectional view showing the method for manufacturing the semiconductor device of the first embodiment of the present disclosure, taken along line XXIVb-XXIVb of FIG. 22B in the gate width direction.

In this embodiment, the gate electrode 21a is formed by performing patterning two times, and therefore, as shown in FIG. 16A, the gate electrode 21a has a rectangular shape as viewed from above. On the other hand, the gate electrode 21b is formed by performing patterning once, and therefore, as shown in FIG. 10B, the gate electrode 21b has a rectangular shape with rounded corners.

In this embodiment, the gate electrode 21a can have a rectangular shape as viewed from above. Therefore, even if the protrusion amount d1 (e.g., 100 nm) is smaller than the protrusion amount d2 (e.g., 200 nm), the gate length of the gate electrode 21a between the opposite ends in the gate width direction of the active region 10a can be caused to be constant. Therefore, the width in the gate width direction of the gate electrode 21a can be reduced.

Thereafter, the resist patterns Re3 and Re4 are removed.

Next, as shown in FIGS. 16A-18B, a film for forming outer offset sidewalls which is formed, for example, of SiN having a thickness of 3 nm is formed on an entire surface of the semiconductor substrate 10, for example, by ALD. Thereafter, for example, anisotropic dry etching is performed on the film for forming outer offset sidewalls. As a result, the outer offset sidewalls 24a (second offset sidewalls) are formed on the side surfaces in the gate length and width directions of the gate electrode 21a with the inner offset sidewalls 22a being interposed between the outer offset sidewalls 24a and the gate electrode 21a. In addition, the outer offset sidewalls 24b (fourth offset sidewalls) are formed on the side surfaces in the gate length and width directions of the gate electrode 21b with the inner offset sidewalls 22b being interposed between the outer offset sidewalls 24b and the gate electrode 21b.

The offset sidewalls 24a and 24b have a width of, for example, 3 nm.

Thus, the offset sidewall 25A including the inner offset sidewall 22a and the outer offset sidewall 24a is formed. In addition, the offset sidewall 25B including the inner offset sidewall 22b and the outer offset sidewall 24b is formed.

Next, as shown in FIGS. 16A-18B, a resist pattern (not shown) which does not cover the L-nMIS region and covers the H-nMIS region is formed on the semiconductor substrate 10. Thereafter, n-type impurity (e.g., As, etc.) ions are implanted into the active region 10a using the resist pattern and the outer offset sidewalls 24a as a mask, for example, at an implantation energy of 1.5 keV and a dose of $1\times10^{15}$ cm$^{-2}$. As a result, n-type extension implantation regions 26x are formed in a self-aligned manner.

In this embodiment, the n-type extension implantation regions 26x are formed without washing after the formation of the outer offset sidewalls 24a which are in contact with the side surfaces in the gate length direction of the gate electrode 21a. Therefore, the outer offset sidewalls 24a any portion of which is not removed by washing (in other words, the outer offset sidewalls 24a having the desired width (e.g., 3 nm)) can be used as a mask to form the n-type extension implantation regions 26x. Therefore, the decrease of the effective gate length of the gate electrode 21a can be reduced or prevented.

Thereafter, washing is performed using, for example, a sulfuric acid-based chemical solution, for example, at a temperature of 40° C. for 10 min. As a result, the resist pattern is removed. In this case, a portion of the outer offset sidewalls 24a and 24b is likely to be removed by the washing.

In this embodiment, the outer offset sidewalls 24a are not covered by a resist pattern before the washing. On the other hand, the outer offset sidewalls 24b are covered by a resist pattern before the washing.

Therefore, the outer offset sidewalls 24a are exposed to the chemical solution during a period of time (relatively long time) from the start to end of the washing. On the other hand, the outer offset sidewalls 24b are exposed to the chemical solution during a period of time (relatively short time) from the removal of the resist pattern to the end of the washing.

Therefore, when the outer offset sidewalls 24a and 24b are easily removed by the washing, the amount of the outer offset sidewalls 24a which are removed is greater than the amount of the outer offset sidewalls 24b which are removed. Therefore, the width of the outer offset sidewall 24a after the washing is smaller than the width of the outer offset sidewall 24b after the washing.

On the other hand, when the outer offset sidewalls 24a and 24b are not easily removed by the washing, the outer offset sidewalls 24a and 24b are exposed to the chemical solution during different periods of time, but are removed to substantially the same extent. Therefore, the width of the outer offset sidewall 24a after the washing is the same as the width of the outer offset sidewall 24b after the washing.

Note that, in this embodiment, the widths of the outer offset sidewalls 24a and 24b before the washing are, for example, 3 nm. Alternatively, the widths of the outer offset sidewalls 24a and 24b before the washing may be the following.

When the widths of the outer offset sidewalls 24a and 24b before the washing are excessively broad, it is difficult to cause the n-type extension regions (see 26a in FIG. 23A described below) to overlap the gate electrode 21a by a thermal treatment performed after the washing. Therefore, the widths of the outer offset sidewalls 24a and 24b before the washing are preferably, for example, 5 nm or less.

When the widths of the outer offset sidewalls 24a and 24b before the washing are excessively narrow, the outer offset sidewalls 24a and 24b are completely removed by the washing, and the metal films 19a and 19 are likely to be dissolved by the washing. Therefore, the widths of the outer offset sidewalls 24a and 24b before the washing are preferably, for example, more than 0.7 nm (=0.5 nm+0.2 nm). Note that the present inventor conducted measurement to obtain the following measurement result. When washing was performed on the offset sidewall formed of SiN by ALD using a sulfuric acid-based chemical solution at a temperature of 40° C. for 10 min, the amount of the offset sidewall removed was, for example, 0.5 nm±0.2 nm.

Next, as shown in FIGS. 19A-21B, a film for forming inner sidewalls which is formed, for example, of $SiO_2$ and a film for forming outer sidewalls which is formed, for example, of SiN are successively formed on an entire surface of the semiconductor substrate 10, for example, by CVD. Thereafter, for example, anisotropic dry etching is performed on the film for forming outer sidewalls and the film for forming inner sidewalls successively. As a result, the sidewalls 29A are formed on the side surfaces in the gate length and width directions of the gate electrode 21a with the offset sidewalls 25A being interposed between the sidewalls 29A and the gate electrode 21a. In addition, the sidewalls 29B are formed on the side surfaces in the gate length and width directions of the gate electrode 21b with the offset sidewalls 25B being interposed between the sidewalls 29B and the gate electrode 21b. The sidewalls 29A and 29B include the inner sidewalls 27a and 27b having an L-shaped cross-section and the outer sidewalls 28a and 28b, respectively.

Next, as shown in FIGS. 19A-21B, n-type impurity (e.g., As, etc.) ions are implanted into the active regions 10a and 10b, for example, at an implantation energy of 10 keV and a dose of $1 \times 10^{15}$ $cm^{-2}$. As a result, n-type source/drain implantation regions 30x and 30y are formed in a self-aligned manner.

Next, as shown in FIGS. 22A-24B, for example, a thermal treatment is performed at 1000° C.

As a result, the n-type impurity contained in the n-type extension implantation regions 26x is activated and diffused to form the n-type extension regions 26a (first extension regions) overlapping the gate electrode 21a.

In addition, the n-type impurity contained in the n-type extension regions 23b is activated.

In addition, the n-type impurity contained in the n-type source/drain implantation regions 30x and 30y is activated to form the n-type source/drain regions 30a and 30b.

The implantation energy (e.g., 1.5 keV) of the n-type extension implantation region 26x is lower than that (e.g., 10 keV) of the n-type extension implantation region 23y. Therefore, the diffusion depth of the n-type extension region 26a is shallower than that of the n-type extension region 23b.

The dose (e.g., $1 \times 10^{15}$ $cm^{-2}$) of the n-type extension implantation region 26x is greater than that (e.g., $2 \times 10^{14}$ $cm^{-2}$) of the n-type extension implantation region 23y. Therefore, the n-type impurity concentration of the n-type extension region 26a is higher than that of the n-type extension region 23b.

As shown in FIGS. 19A-21B described above, the n-type source/drain implantation regions 30x and 30y are formed by the same process (in other words, under the same ion implantation conditions). Therefore, the diffusion depth of the n-type source/drain region 30a is the same as that of the n-type source/drain region 30b. The n-type impurity concentration of the n-type source/drain region 30a is the same as that of the n-type source/drain region 30b.

Next, as shown in FIGS. 22A-24B, the silicide films 31a and 31b are formed on the gate electrodes 21a and 21b, respectively. In addition, the silicide films 32a and 32b are formed on the n-type source/drain regions 30a and 30b, respectively.

Thus, the semiconductor device of this embodiment can be manufactured.

In this embodiment, as shown in FIGS. 10A-12B, the n-type extension implantation regions 23y are formed without washing after the formation of the inner offset sidewalls 22b which are in contact with the side surfaces in the gate length direction of the gate electrode 21b. Therefore, the inner offset sidewalls 22b any portion of which is not removed by washing (in other words, the inner offset sidewalls 22b having the desired width) can be used as a mask to form the n-type extension implantation regions 23y. Therefore, the decrease of the effective gate length of the gate electrode 21b can be reduced or prevented. Therefore, even if the gate length of the gate electrode 21b is decreased due to further miniaturization of the semiconductor device, the decrease of the threshold voltage of the high-voltage n-type MIS transistor nTr2 can be reduced or prevented.

On the other hand, as shown in FIGS. 16A-18B, the n-type extension implantation regions 26x are formed without washing after the formation of the outer offset sidewalls 24a which are in contact with the side surfaces in the gate length direction of the gate electrode 21a. Therefore, the outer offset sidewalls 24a any portion of which is not removed by washing (in other words, the outer offset sidewalls 24a having the desired width) can be used as a mask to form the n-type extension implantation regions 26x. Therefore, the decrease of the effective gate length of the gate electrode 21a can be reduced or prevented. Therefore, even if the gate length of the gate electrode 21a is decreased due to further miniaturization of the semiconductor device, the decrease of the threshold voltage of the low-voltage n-type MIS transistor nTr1 can be reduced or prevented.

(Second Embodiment)

Figure 25A:
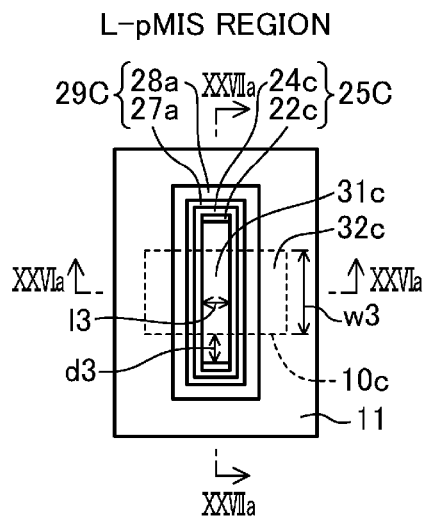
FIGS. 25A and 25B are plan views of a configuration of a semiconductor device according to a second embodiment of the present disclosure.
Figure 25B:
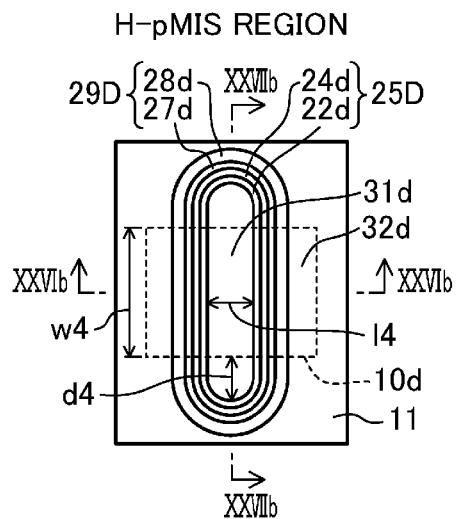
Figure 26A:
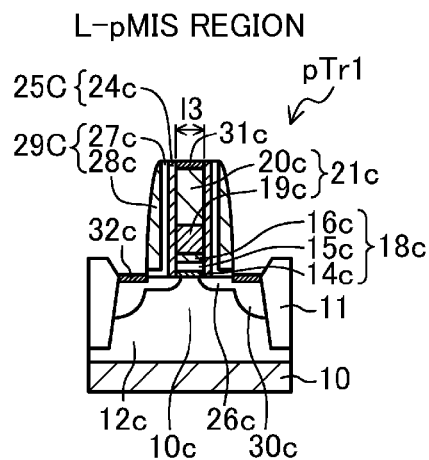
FIG. 26A is a cross-sectional view of the configuration of the semiconductor device of the second embodiment of the present disclosure, taken along line XXVIa-XXVIa of FIG. 25A in the gate length direction.
Figure 26B:
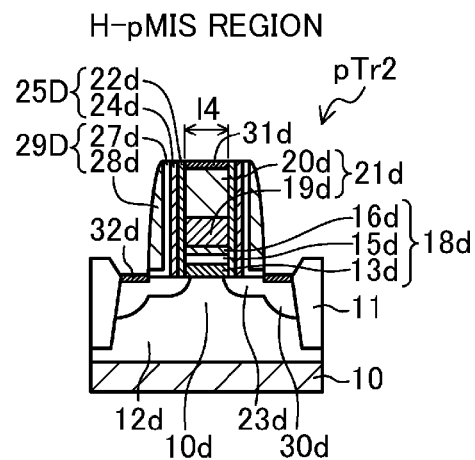
FIG. 26B is a cross-sectional view of the configuration of the semiconductor device of the second embodiment of the present disclosure, taken along line XXVIb-XXVIb of FIG. 25B in the gate length direction.
Figure 27A:
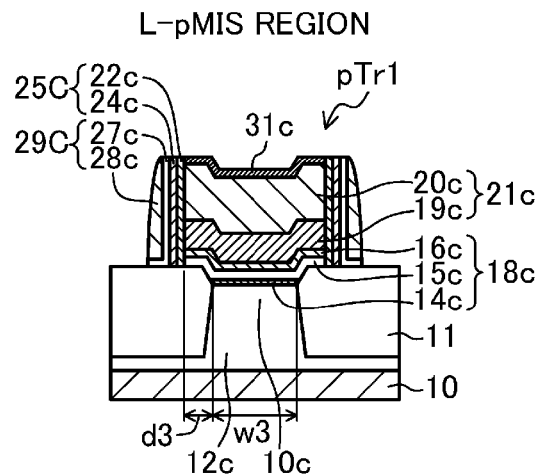
FIG. 27A is a cross-sectional view of the configuration of the semiconductor device of the second embodiment of the present disclosure, taken along line XXVIIa-XXVIIa of FIG. 25A in the gate width direction.
Figure 27B:
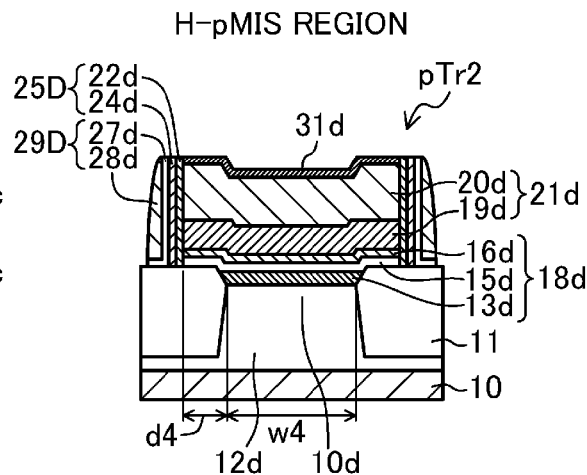
FIG. 27B is a cross-sectional view of the configuration of the semiconductor device of the second embodiment of the present disclosure, taken along line XXVIIb-XXVIIb of FIG. 25B in the gate width direction.
Figure 28A:
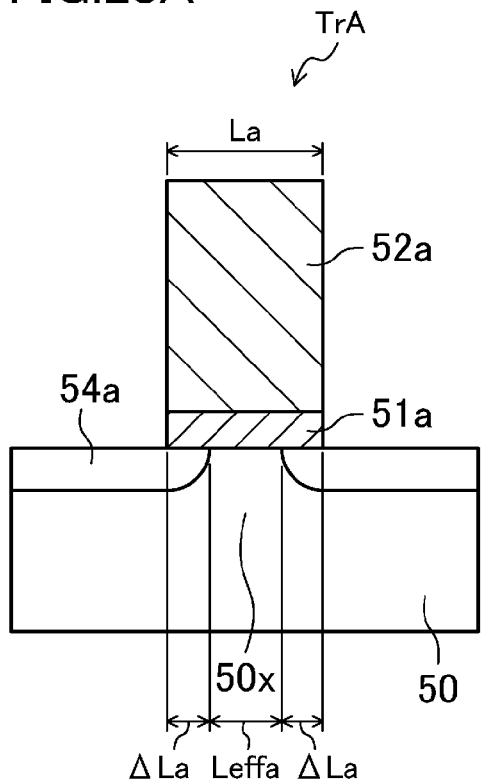
FIG. 28A is a cross-sectional view of a first comparative example semiconductor device, taken along the gate length direction.
Figure 28B:
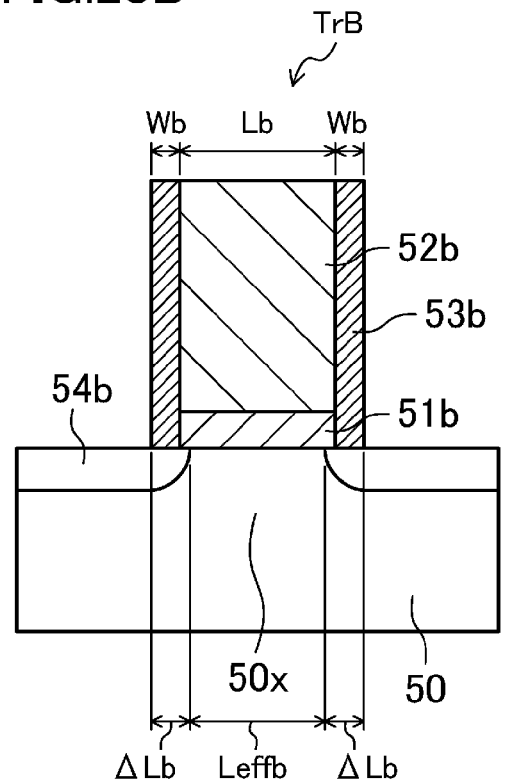
FIG. 28B is a cross-sectional view of a second comparative example semiconductor device, taken along the gate length direction.
Figure 29:
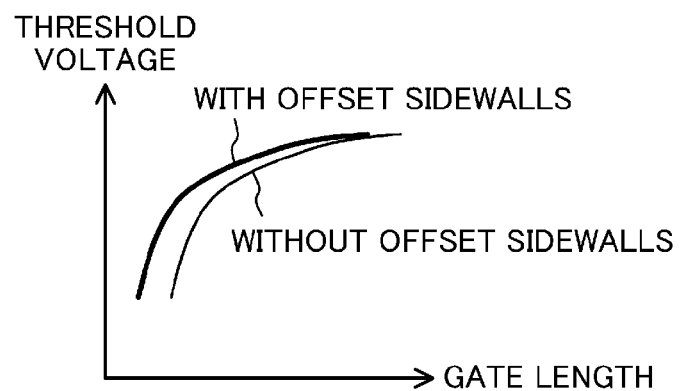
FIG. 29 is a diagram showing a relationship between a gate length of a gate electrode and a threshold voltage of a MIS transistor.
Figure 30A:
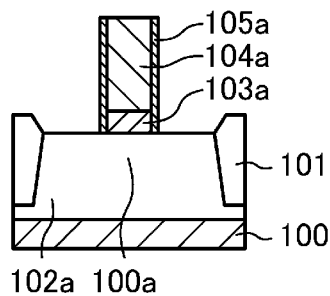
FIGS. 30A and 30B are cross-sectional views taken along the gate length direction, showing a process for forming extension regions.
Figure 30B:
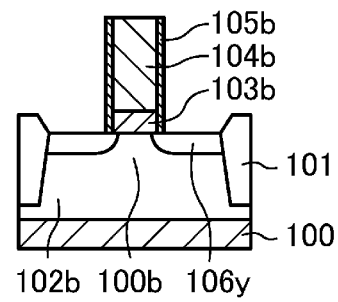
Figure 31A:
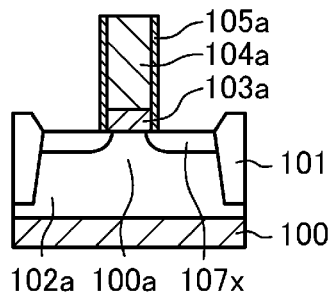
FIGS. 31A and 31B are cross-sectional views taken along the gate length direction, showing the process for forming extension regions.
Figure 31B:
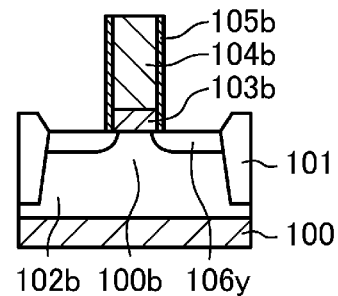

A semiconductor device according to a second embodiment of the present disclosure will be described hereinafter with reference to FIGS. 25A and 25B, 26A and 26B, and 27A and 27B. FIGS. 25A and 25B are plan views of a configuration of the semiconductor device of the second embodiment of the present disclosure. FIGS. 26A and 26B are cross-sectional views of a configuration of the semiconductor device of the second embodiment of the present disclosure, taken along the gate length direction. FIGS. 27A and 27B are cross-sectional views of a configuration of the semiconductor device of the second embodiment of the present disclosure, taken along the gate width direction. An "L-pMIS region" shown in FIGS. 25A-27A refers to a region in which a low-voltage p-type MIS transistor is formed. An "H-pMIS region" shown in FIGS. 25B-27B refers to a region in which a high-voltage p-type MIS transistor is formed.

As shown in FIGS. 25A-27A, the semiconductor device of this embodiment includes a low-voltage p-type MIS transistor pTr1 (first MIS transistor) and a high-voltage p-type MIS transistor pTr2 (second MIS transistor). A power supply voltage to the low-voltage p-type MIS transistor pTr1 is, for example, 1.0 V. A power supply voltage to the high-voltage p-type MIS transistor pTr2 is, for example, 1.8 V.

As shown in FIGS. 26A and 27A, the low-voltage p-type MIS transistor pTr1 includes a gate insulating film 18c (first gate insulating film) formed on an active region 10c (first active region), a gate electrode 21c (first gate electrode) formed on the gate insulating film 18c, inner offset sidewalls 22c (first offset sidewalls) formed on side surfaces in the gate width direction of the gate electrode 21c, outer offset sidewalls 24c (second offset sidewalls) formed on side surfaces in the gate length direction and the side surfaces in the gate width direction of the gate electrode 21c with the inner offset sidewalls 22c being interposed between the outer offset sidewalls 24c and the gate electrode 21c, p-type extension regions 26c (first extension regions) formed in the active region 10c adjacent to the channel region and extending laterally away from the channel region (hereinafter also referred to as "formed in the active region 10c laterally outside the gate electrode 21c"), sidewalls 29C formed on the side surfaces in the gate length and width directions of the gate electrode 21c with the offset sidewalls 25C being interposed between the sidewalls 29C and the gate electrode 21c, p-type source/drain regions 30c formed in the active region 10c adjacent to the respective p-type extension regions 26c and extending laterally away from the respective p-type extension regions 26c (hereinafter also referred to as "formed in the active region 10c laterally outside the sidewalls 29C"), a silicide film 31c formed on the gate electrode 21c, and a silicide film 32c formed on the p-type source/drain regions 30c.

As shown in FIGS. 26B and 27B, the high-voltage p-type MIS transistor pTr2 includes a gate insulating film 18d (second gate insulating film) formed on an active region 10d (second active region), a gate electrode 21d (second gate electrode) formed on the gate insulating film 18d, inner offset sidewalls 22d (third offset sidewalls) formed on side surfaces in the gate length and width directions of the gate electrode 21d, outer offset sidewalls 24d (fourth offset sidewalls) formed on the side surfaces in the gate length and width directions of the gate electrode 21d with the inner offset sidewalls 22d being interposed between the outer offset sidewalls 24d and the gate electrode 21d, p-type extension regions 23d (second extension regions) formed in the active region 10d adjacent to the channel region and extending laterally away from the channel region (hereinafter also referred to as "formed in the active region 10d laterally outside the gate electrode 21d"), sidewalls 29D formed on the side surfaces in the gate length and width directions of the gate electrode 21d with the offset sidewalls 25D being interposed between the sidewalls 29D and the gate electrode 21d, p-type source/drain regions 30d formed in the active region 10d adjacent to the respective p-type extension regions 23d and extending laterally away from the respective p-type extension regions 23d (hereinafter also referred to as "formed in the active region 10d laterally outside the sidewalls 29D"), a silicide film 31d formed on the gate electrode 21d, and a silicide film 32d formed on the p-type source/drain regions 30d.

As shown in FIGS. 26A and 27A, the gate insulating film 18c includes an underlying film 14c, a high dielectric constant film (high-k film) 15c, and an adjustment metal film 16c containing an adjustment metal (e.g., aluminum (Al)). As shown in FIGS. 26B and 27B, the gate insulating film 18d includes an underlying film 13d, a high-k film 15d, and an adjustment metal film 16d containing an adjustment metal (e.g., Al).

The underlying film 14c has a thickness (e.g., 0.7 nm) smaller than that (e.g., 3.0 nm) of the underlying film 13d. The high-k film 15c has the same thickness as that of the high-k film 15d. The adjustment metal film 16c has the same thickness as that of the adjustment metal film 16d. Therefore, the gate insulating film 18c has a thickness smaller than that of the gate insulating film 18d.

The thickness (e.g., 0.7 nm) of the underlying film 14c is smaller than those (e.g., 1.5 nm) of the high-k films 15c and 15d. On the other hand, the thickness (e.g., 3.0 nm) of the underlying film 13d is greater than those (e.g., 1.5 nm) of the high-k films 15c and 15d. The thickness (e.g., 0.7 nm) of the underlying film 14c is greater than those (e.g., 0.5 nm) of the adjustment metal films 16c and 16d. On the other hand, the thickness (e.g., 3.0 nm) of the underlying film 13d is greater than those (e.g., 0.5 nm) of the adjustment metal films 16c and 16d.

Note that the adjustment metal contained in the adjustment metal films 16c and 16d may be introduced into the high-k films 15c and 15d, respectively, during a thermal treatment (e.g., a thermal treatment for activating the p-type impurity contained in the p-type source/drain implantation regions) during the production. Therefore, the high-k films 15c and 15d may contain the adjustment metal.

As shown in FIGS. 26A and 27A, the gate electrode 21c includes a metal film 19c and a silicon film 20c. As shown in FIGS. 26B and 27B, the gate electrode 21d includes a metal film 19d and a silicon film 20d.

As shown in FIG. 25A, the gate electrode 21c has, for example, a rectangular shape as viewed from above. As shown in FIG. 25B, the gate electrode 21d has a rectangular shape with rounded corners as viewed from above. In other words, the gate electrode 21d has a rectangular portion and semicircular portions connected to ends of the rectangular portion as viewed from above.

A gate length l3 (see FIGS. 25A and 26A; e.g., 30 nm) of the gate electrode 21c is smaller than a gate length l4 (see FIGS. 25B and 26B; e.g., 150 nm) of the gate electrode 21d. The gate length of the gate electrode 21c, 21d refers to the width in the gate length direction of the gate electrode 21c, 21d.

A gate width w3 (see FIGS. 25A and 27A; e.g., 150 nm) of the active region 10c is smaller than a gate width w4 (see FIGS. 25B and 27B; e.g., 300 nm) of the active region 10d. The gate width of the active region 10c, 10d refers to the width in the gate width direction of the surface of the active region 10c, 10d.

A protrusion amount d3 (see FIGS. 25A and 27A; e.g., 100 nm) of the gate electrode 21c protruding above an isolation region 11 is smaller than a protrusion amount d4 (see FIGS. 25B and 27B; e.g., 200 nm) of the gate electrode 21d protruding above the isolation region 11. The protrusion amount d3, d4 refers to an amount from one end in the gate width direction of the active region 10c, 10d to one end (side surface) in the gate width direction of the gate electrode 21c, 21d.

The inner offset sidewall 22c has the same width as that of the inner offset sidewall 22d.

The outer offset sidewall 24c has a width which is smaller than or the same as that of the outer offset sidewall 24d.

The width of the inner offset sidewall 22c is greater than that of the outer offset sidewall 24c. The inner offset sidewall 22d has a width greater than that of the outer offset sidewall 24d.

The p-type extension region 26c has a diffusion depth smaller than that of the p-type extension region 23d. The p-type extension region 26c has a p-type impurity concentration higher than that of the p-type extension region 23d. The diffusion depth of the p-type extension region 26c, 23d refers to a depth from the surface of the active region 10c, 10d to the junction surface of the p-type extension region 26c, 23d.

As shown in FIGS. 26A-27B, the sidewalls 29C and 29D include inner sidewalls 27c and 27b having an L-shaped cross-section and outer sidewalls 28c and 28d, respectively. The sidewall 29C has the same width as that of the sidewall 29D.

The p-type source/drain region 30c has the same diffusion depth as that of the p-type source/drain region 30d. The p-type source/drain region 30c has the same p-type impurity concentration as that of the p-type source/drain region 30d.

The semiconductor device of this embodiment can be manufactured by a method similar to that for the semiconductor device of the first embodiment.

Specifically, for example, the semiconductor device of this embodiment can be manufactured as follows.

Initially, steps similar to those shown in FIGS. 4A-6B are performed. Note that, in this embodiment, an adjustment metal film containing an adjustment metal (e.g., Al) is formed instead of the adjustment metal film 16 containing an adjustment metal (e.g., La).

Next, steps similar to those shown in FIGS. 7A-9B are performed. Note that, in this embodiment, a thermal treatment similar to that of the first embodiment (specifically, a thermal treatment for introducing the adjustment metal contained in the adjustment metal film 16 into the high-k film 15), and etching similar to that of the first embodiment (specifically, wet etching for removing an unreacted portion of the adjustment metal film 16) are not performed.

Next, steps similar to those shown in FIGS. 10A-12B are performed. Note that, in this embodiment, p-type extension implantation regions are formed instead of n-type extension implantation regions. A p-type impurity (e.g., boron fluoride ($BF_2$), etc.) ions are implanted into the active region 10d, for example, at an implantation energy of 5 keV and a dose of $2 \times 10^{14}$ $cm^{-2}$. As a result, p-type source/drain implantation regions are formed.

Next, steps similar to those shown in FIGS. 13A-15B are performed.

Next, steps similar to those shown in FIGS. 16A-18B are performed. Note that, in this embodiment, p-type extension implantation regions are formed instead of n-type extension implantation regions. A p-type impurity (e.g., $BF_2$, etc.) ions are implanted into the active region 10c, for example, at an implantation energy of 1 keV and a dose of $1 \times 10^{15}$ $cm^{-2}$. As a result, p-type extension implantation regions are formed.

Next, steps similar to those shown in FIGS. 19A-21B are performed. Note that, in this embodiment, p-type source/drain implantation regions are formed instead of n-type source/drain implantation regions.

Next, steps similar to those shown in FIGS. 22A-24B are performed.

Thus, the semiconductor device of this embodiment can be manufactured.

In this embodiment, advantages similar to those of the first embodiment can be obtained.

In the first embodiment, as a specific illustration, as shown in FIGS. 2A and 3A, the underlying film 14a is formed between the active region 10a and the high-k film 17a. The present disclosure is not limited to this. For example, no underlying film may be formed between the active region and the high-k film. Similarly, in the second embodiment, as a specific illustration, as shown in FIGS. 26A and 27A, the underlying film 14c is formed between the active region 10c and the high-k film 15c. The present disclosure is not limited to this. For example, no underlying film may be formed between the active region and the high-k film.

In the first embodiment, as a specific illustration, the underlying films 14a and 13b formed of $SiO_2$ are employed. The present disclosure is not limited to this. For example, an underlying film formed of silicon oxynitride (SiON) may be employed.

In the first embodiment, as a specific illustration, the high-k film 17b containing an adjustment metal (e.g., La) is employed. The present disclosure is not limited to this. For example, a high-k film which does not contain an adjustment metal may be employed.

In the second embodiment, as a specific illustration, the adjustment metal film 16d containing an adjustment metal (e.g., Al) is formed between the high-k film 15d and the metal film 19d. The present disclosure is not limited to this. For example, no adjustment metal film may be formed between the high-k film and the metal film.

In the first embodiment, as a specific illustration, La is used as the adjustment metal. The present disclosure is not limited to this. For example, other lanthanoid elements, magnesium (Mg), etc., may be used instead of La.

In the second embodiment, as a specific illustration, the adjustment metal film containing Al (specifically, for example, an adjustment metal film formed of aluminum oxide ($Al_2O_3$) or Al) is employed. The present disclosure is not limited to this. For example, an adjustment metal film formed of tantalum oxide (TaO) may be employed.

In the first embodiment, as a specific illustration, the films for forming inner and outer offset sidewalls which are formed of SiN are formed by ALD. The present disclosure is not limited to this. Firstly, for example, the films for forming inner and outer offset sidewalls which are formed of SiN may be formed by CVD. Secondly, for example, films for forming inner and outer offset sidewalls which are formed of $SiO_2$ may be formed by ALD or CVD.

In the first embodiment, as a specific illustration, the resist pattern which is used as a mask during the formation of the n-type extension implantation region 26x is removed by washing using a sulfuric acid-based chemical solution. The present disclosure is not limited to this. For example, the resist pattern may be removed by ashing, and thereafter, a polymer generated during the ashing may be removed by washing using an ammonia-based or hydrochloric acid-based chemical solution.

As described above, according to the present disclosure, the decrease of the effective gate lengths of the first and second gate electrodes can be reduced or prevented. The present disclosure is useful for a semiconductor device including a first and a second MIS transistor having a first and a second gate electrode and a method for manufacturing the semiconductor device.

What is claimed is:

1. A semiconductor device including a first MIS transistor and a second MIS transistor, wherein
   the first MIS transistor includes:
      a first gate insulating film formed on a first active region of a semiconductor substrate and including a first high dielectric constant film,
      a first gate electrode formed on the first gate insulating film,
      first offset sidewalls formed on side surfaces in a gate length direction of the first gate electrode,
      second offset sidewalls formed on side surfaces in a gate length direction and the side surfaces of the gate width direction of the first gate electrode with the first offset sidewalls being interposed between the second offset sidewalls and the first gate electrode, and first extension regions formed in the first active region laterally outside the first gate electrode, the second MIS transistor includes:

a second gate insulating film formed on a second active region of the semiconductor substrate and including a second high dielectric constant film, a second gate electrode formed on the second gate insulating film, third offset sidewalls formed on side surfaces in a gate length direction and a gate width direction of the second gate electrode, fourth offset sidewalls formed on the side surfaces in the gate length and width directions of the second gate electrode with the third offset sidewalls being interposed between the fourth offset sidewalls and the second gate electrode, and second extension regions formed in the second active region laterally outside the second gate electrode, and the first offset sidewalls are formed along the gate length direction but not formed along the gate width direction of the first gate electrode.

2. The semiconductor device of claim 1, wherein the second gate insulating film has a thickness greater than that of the first gate insulating film.

3. The semiconductor device of claim 1, wherein the second gate insulating film includes a first underlying film formed on the second active region, and the second high dielectric constant film formed on the first underlying film, and the first underlying film has a thickness greater than that of the second high dielectric constant film.

4. The semiconductor device of claim 3, wherein the first gate insulating film includes a second underlying film formed on the first active region, and the first high dielectric constant film formed on the second underlying film, and the second underlying film has a thickness smaller than those of the first high dielectric constant film and the first underlying film.

5. The semiconductor device of claim 1, wherein the first gate electrode has a width in the gate length direction smaller than that of the second gate electrode.

6. The semiconductor device of claim 1, wherein the first active region has a width in the gate width direction smaller than that of the second active region.

7. The semiconductor device of claim 1, further comprising:

an isolation region formed in the semiconductor substrate to surround each of the first and second active regions, wherein the first gate electrode is formed on the first active region and the isolation region, the second gate electrode is formed on the second active region and the isolation region, and the first gate electrode protruding above the isolation region has a protrusion amount smaller than that of the second gate electrode protruding above the isolation region.

8. The semiconductor device of claim 1, wherein the first offset sidewall has a width which is the same as that of the third offset sidewall, and the second offset sidewall has a width which is smaller than or the same as that of the fourth offset sidewall.

9. The semiconductor device of claim 1, wherein the first offset sidewall has a width greater than that of the second offset sidewall, and the third offset sidewall has a width greater than that of the fourth offset sidewall.

10. The semiconductor device of claim 1, wherein the first extension regions have a diffusion depth smaller than that of the second extension regions.

11. The semiconductor device of claim 1, wherein the first extension regions have an impurity concentration higher than that of the second extension regions.

12. The semiconductor device of claim 1, wherein the first gate electrode has a rectangular shape as viewed from above, and the second gate electrode has a rectangular shape with rounded corners as viewed from above.

13. The semiconductor device of claim 1, wherein the first MIS transistor has a power supply voltage lower than that of the second MIS transistor.

14. The semiconductor device of claim 1, wherein the first gate electrode includes a first metal film formed on the first gate insulating film, and a first silicon film formed on the first metal film, and the second gate electrode includes a second metal film formed on the second gate insulating film, and a second silicon film formed on the second metal film.

15. The semiconductor device of claim 1, wherein the first gate insulating film includes an adjustment metal.

16. The semiconductor device of claim 15, wherein the first and second MIS transistors are each an n-type MIS transistor, and the adjustment metal is lanthanum.

17. The semiconductor device of claim 15, wherein the first and second MIS transistors are each a p-type MIS transistor, and the adjustment metal is aluminum.

* * * * *